United States Patent
Yokogawa et al.

(10) Patent No.: US 6,740,416 B1
(45) Date of Patent: May 25, 2004

(54) AEROGEL SUBSTRATE AND METHOD FOR PREPARING THE SAME

(75) Inventors: Hiroshi Yokogawa, Osaka (JP); Masaru Yokoyama, Osaka (JP); Kenji Tsubaki, Osaka (JP); Kenji Kawano, Osaka (JP); Kenji Sonoda, Kyoto (JP)

(73) Assignee: Matsushita Electric Works, Ltd., Kadoma (JP)

( * ) Notice: Subject to any disclaimer, the term of this patent is extended or adjusted under 35 U.S.C. 154(b) by 0 days.

(21) Appl. No.: 09/830,572

(22) PCT Filed: Nov. 9, 2000

(86) PCT No.: PCT/JP00/07856

§ 371 (c)(1),
(2), (4) Date: May 8, 2001

(87) PCT Pub. No.: WO01/34382

PCT Pub. Date: May 17, 2001

(30) Foreign Application Priority Data

Nov. 10, 1999 (JP) .......................................... 11/319858

(51) Int. Cl.[7] .......................... B32B 13/04; C23C 16/00
(52) U.S. Cl. .................. 428/446; 428/450; 428/448; 428/698; 428/209; 428/702; 428/913; 428/690; 427/255.18; 427/255.19; 427/255.28; 427/255.6; 427/255.7
(58) Field of Search .......................... 428/446, 450, 428/448, 698, 209, 690, 913, 702; 359/356; 385/2.8; 427/255.18, 255.19, 255.28, 255.6, 255.7

(56) References Cited

U.S. PATENT DOCUMENTS

| 4,402,927 A | 9/1983 | Von Dardel et al. |
|---|---|---|
| 4,432,956 A | 2/1984 | Zarzycki et al. |
| 4,610,863 A | 9/1986 | Tewari et al. |
| 5,086,085 A | 2/1992 | Pekala |
| 5,124,364 A | 6/1992 | Wolff et al. |
| 5,137,927 A | 8/1992 | Wolff et al. |
| 5,221,364 A | * 6/1993 | Hotaling ..................... 136/249 |
| 5,569,058 A | * 10/1996 | Gnade et al. .................. 445/24 |
| 5,759,506 A | 6/1998 | Jansen et al. |
| 5,830,387 A | 11/1998 | Yokogawa et al. |

FOREIGN PATENT DOCUMENTS

| JP | 5-279011 | 10/1993 |
|---|---|---|
| JP | 6-227809 | 8/1994 |

(List continued on next page.)

OTHER PUBLICATIONS

Tetsuo Tsutsui, et al., Doubling Coupling–Out Efficiency in Organic Light–Emitting Devices Using a Thin Silica Aerogel Layer, Advanced Materials, vol. 13, No. 15, Aug. 3, 2001, pp. 1149–1152.

(List continued on next page.)

*Primary Examiner*—Deborah Jones
*Assistant Examiner*—Ling Xu
(74) *Attorney, Agent, or Firm*—Oblon, Spivak, McClelland, Maier & Neustadt, P.C.

(57) ABSTRACT

An aerogel substrate useful for an electrically conductive substrate, a heat insulating substrate, an optical waveguide substrate, a substrate for a light emitting device or a light emitting device is provided.

The aerogel substrate is characterized by comprising a functional layer and an aerogel layer, and an intermediate layer formed between the functional layer and the aerogel layer to allow the functional layer to be formed uniformly thereon. The intermediate layer is formed on at least one surface of the aerogel layer by a gas phase method, by the Langmuir-Blodgett method or by adsorption of an inorganic layered compound; or formed by a hydrophilicizing treatment of at least one surface of the aerogel layer followed by coating and drying an aqueous coating fluid, by an annealing treatment of at least one surface of the aerogel layer, or by a hydrophilicizing treatment of at least one surface of the aerogel layer.

25 Claims, 3 Drawing Sheets

FOREIGN PATENT DOCUMENTS

| | | |
|---|---|---|
| JP | 7-138375 | 5/1995 |
| JP | 7-213877 | 8/1995 |
| JP | 8-504674 | 5/1996 |
| JP | 8-508535 | 9/1996 |
| JP | 10-508569 | 8/1998 |
| JP | 10-324579 | 12/1998 |
| JP | 10-324585 | 12/1998 |
| WO | WO 94/22943 | 10/1994 |
| WO | WO 94/25149 | 11/1994 |

OTHER PUBLICATIONS

U.S. patent application Ser. No. 09/708,657, filed Nov. 9, 2000, pending.

U.S. patent application Ser. No. 09/830,572, filed May 8, 2001, pending.

Stefan Walheim, et al., Science, vol. 283, pp. 520–522, "Nanophase–Separated Polymer Films As High–Performance Antireflection Coatings", Jan. 22, 1999.

* cited by examiner (a)

(b)

(c)

(a)

(b)

(a)

(b)

(c)

AEROGEL SUBSTRATE AND METHOD FOR PREPARING THE SAME

TECHNICAL FIELD

The present invention relates to an aerogel substrate comprising an aerogel layer and a functional layer formed on a surface of the aerogel layer and a process for the production of the substrate.

BACKGROUND ART

An aerogel, particularly a silica aerogel has characteristic properties such as a heat insulating property, an electrically insulating property, a low refractive index and a low dielectric constant. Studies have been made to apply the aerogel to various fields using its properties. For example, a highly functional substrate can be manufactured by forming a thin film of a silica aerogel on a surface of a plate member such as a glass plate and so on and further forming a functional thin film on a surface of the silica aerogel thin film. For example, in the case where an electrically conductive metal (such as copper) thin film is formed as the functional thin film on the surface of the silica aerogel thin film and a circuit is formed with the electrically conductive metal thin film, a circuit board can be obtained in which the low dielectric constant of the silica aerogel is utilized.

The silica aerogel is prepared by hydrolyzing an alkoxysilane (which is referred to also as a silicon alkoxide or an alkyl silicate) followed by polycondensation of the alkoxysilane to obtain a gel compound, and drying the gel compound in the presence of a dispersion medium under supercritical conditions exceeding a critical point of the solvent, as disclosed in U.S. Pat. Nos. 4,402,927, 4,432,956 and 4,610,863. Further, as disclosed in Japanese Patent Kokai Publications Nos. 5-279011 and 7-138375, a hydrophobing treatment (a treatment for making a silica aerogel hydrophobic) improves moisture resistance of the silica aerogel and prevents deterioration of characteristic properties of the silica aerogel.

DISCLOSURE OF INVENTION

In order to produce a highly functional substrate using an aerogel such as a silica aerogel, it is required that a functional thin film is formed uniformly on a surface of the aerogel. However, it is difficult to form the thin film uniformly on the surface of the aerogel since the aerogel is a porous material. For this reason, a highly functional substrate in which an aerogel is used has not currently been put to its practical use.

The present invention has been accomplished in the light of the circumstances as described above, of which object is to provide an aerogel substrate which comprises an aerogel layer and a functional layer formed uniformly on a surface of the aerogel layer, and a process for producing the aerogel substrate.

In the first aspect, the present invention provides an aerogel substrate which comprises an aerogel layer, an intermediate layer which is formed on at least one surface of the aerogel layer and a functional layer which is formed on a surface of the intermediate layer, the functional layer being formed on the surface of the intermediate layer without penetration of a material constituting the functional layer into the aerogel layer.

"Without penetration of a material constituting the functional layer into the aerogel layer" means that penetration of the material(s) which constitutes the functional layer into the aerogel layer through pores in the aerogel layer does not occur during and after formation of the functional layer. Such functional layer constitutes the aerogel substrate as a uniform layer (e.g. a thin uniform film) of which surface is continuous with a small surface roughness and performs a predetermined function well.

The aerogel substrate of the present invention is obtained by making the intermediate layer as a layer which prevents the material(s) which constitutes the functional layer from penetrating into the aerogel layer. "Preventing the material(s) which constitutes the functional layer from penetrating into the aerogel layer" means preventing the material(s) which forms the functional layer from penetrating into the aerogel through the pores in the aerogel layer during and after the formation of the functional layer. In the case where the formation of the functional layer involves a material which does not remain in the functional layer ultimately (for example, a solvent which evaporates by drying), the intermediate layer prevents also the penetration of such material. Therefore, the functional layer which is formed on the surface of the intermediate layer is a uniform layer (e.g. a thin uniform film) of which surface is continuous with a small surface roughness.

It is not necessarily needed that the intermediate layer completely prevents the penetration of the material(s) which constitutes the functional layer into the aerogel layer. As long as the functional layer is formed so uniformly that it can perform a desired function depending on its use or the like, it is acceptable that only a small amount of the material(s) constituting the functional layer penetrates into the aerogel layer. For example, in the case where the intermediate layer is not continuous in a part thereof and micropores (such as pinholes) are formed in the intermediate layer, even if the material(s) constituting the functional layer penetrates into the aerogel layer through the micropores, such penetration is accepted as long as the functional layer is formed uniformly as a whole and performs the desired function.

Alternatively, the aerogel substrate according to the present invention may be constructed by combining a specific intermediate layer with a specific aerogel layer and further selecting a specific material(s) which constitutes the functional layer (such as specific material(s) including a material (such as a solvent to be evaporated by drying) which is used only in the step of forming the functional layer), so that the material(s) constituting the functional layer may penetrate into the intermediate layer, but cannot penetrate into the aerogel layer from the intermediate layer. Such aerogel substrate is realized, for example, by making properties of the intermediate layer different from those of the aerogel layer so that the material(s) constituting the functional layer has an affinity for the intermediate layer and does not have an affinity for the aerogel layer.

In any aerogel layer, the intermediate layer may be a layer which is separately formed on a surface of the aerogel layer, or a layer which is formed by transmuting a part of the aerogel layer. The intermediate layer which is formed by the transmutation of the aerogel layer is substantially inseparably unified with the aerogel layer which is not transmuted, but it is not included in the "aerogel layer" which constitutes the aerogel substrate of the present invention. However, in the case where the intermediate layer is formed by the transmutation of the surface of the aerogel layer, "a surface of the aerogel layer" refers to a surface of the intermediate layer so far as a particular mention is not made.

Any one of the aerogel substrates of the present invention can be said to be a functional substrate of which functional layer can perform a predetermined function. In this specification, the term "substrate" is used in a sense as including a plate member (including a plate, a sheet and a film) of which thickness dimension is considerably smaller than the other dimensions, and a rectangular solid and a cube which have a thickness dimension which is of generally the same order as those of the other dimensions. The substrate includes a plate, a rectangular solid and a cube in which a part of surface is curved. Therefore, each layer which constitutes the aerogel substrate may be in the form of a plate, a sheet, a film, a rectangular solid, or a cube depending on the final form of the aerogel substrate.

The embodiments of the aerogel substrates according to the present invention will be described below.

In the first aspect of the present invention, the first embodiment of the aerogel substrate is an aerogel substrate comprising a hydrophobic aerogel layer, a hydrophilic layer which is formed by subjecting at least one surface of the hydrophobic aerogel layer to a hydrophilicizing treatment (a treatment for imparting hydrophilicity), a coating layer which is formed on a surface of the hydrophilic layer, and a functional layer which is formed on the coating layer. In the first embodiment of the first aspect, the intermediate layer consists of the hydrophilic layer which is formed by subjecting the surface of the hydrophobic aerogel layer to the hydrophilicizing treatment and the coating layer which is formed on the surface of the hydrophilic layer. "Subjecting a hydrophobic aerogel layer to a hydrophilicizing treatment" means removing hydrophobic groups which exist in the hydrophobic aerogel layer, and the hydrophilic layer is a layer in which the hydrophobic groups have been removed.

In this aerogel substrate, the hydrophilic layer and the coating layer are interposed as the intermediate layer between the functional layer and the aerogel layer and function as a base layer for forming the functional layer uniformly. As described below, the hydrophilic layer formed on the surface of the hydrophobic aerogel layer makes it possible for the coating layer to be formed thereon uniformly without penetration of a film-forming component(s) and water into the hydrophobic aerogel layer when the coating layer is formed by coating the surface of the hydrophilic layer with an aqueous solution and/or an aqueous dispersion of the film-forming component(s) followed by drying the solution and/or the dispersion. The coating layer fills or coats the pores in the surface of the hydrophilic layer and prevents the material(s) which constitutes the functional layer from penetrating into the aerogel layer when the functional layer is formed on the surface of the coating layer.

In the first aspect of the present invention, the second embodiment of the aerogel substrate is an aerogel substrate comprising a hydrophobic aerogel layer, a hydrophilic layer which is formed by subjecting at least one surface of the hydrophobic aerogel layer to a hydrophilicizing treatment, and a functional layer which is formed on a surface of the hydrophilic layer. In the second embodiment of the first aspect, the intermediate layer is the hydrophilic layer which is formed by subjecting the surface of the hydrophobic aerogel layer to the hydrophilicizing treatment. This aerogel substrate is a variation in which the coating layer of the above described first embodiment of the aerogel substrate of the first aspect corresponds to the functional layer, which is formed directly on the surface of the aerogel layer (i.e. the intermediate layer). In this aerogel substrate, even if an aqueous solution and/or an aqueous dispersion comprising a film-forming component which is coated on the hydrophilic layer may penetrate into the hydrophilic layer because the surface of the hydrophobic aerogel layer has been transmuted to be hydrophilic, such solution and/or dispersion cannot move from the hydrophilic layer into the hydrophobic aerogel layer. That is, in this aerogel substrate, the combination of the materials which form the aerogel layer, the intermediate layer and the functional layer prevents the material(s) which constitutes the functional layer from penetrating into the aerogel layer.

In the first aspect according to the present invention, the third embodiment of the aerogel substrate is an aerogel substrate comprising an aerogel layer, an inorganic layer or an organic layer which is formed by a gas phase method on at least one surface of the aerogel layer, and a functional layer which is formed on a surface of the inorganic layer or the organic layer. In the third embodiment of the first aspect, the intermediate layer is the inorganic layer or the organic layer which is formed by the gas phase method. The inorganic layer or the organic layer formed by the gas phase method fills or coats the pores in the surface of the aerogel layer and prevents the material(s) Which constitutes the functional layer from penetrating into the aerogel layer when the functional layer is formed on the surface of the inorganic or organic layer. Further, the inorganic or organic layer gives a smooth surface to function as a base coat for forming the functional layer uniformly.

In the first aspect according to the present invention, the fourth embodiment of the aerogel substrate is an aerogel substrate comprising an aerogel layer, a welded layer which is formed by heating at least one surface of the aerogel layer, and a functional layer which is formed on a surface of the welded layer. In the fourth embodiment of the first aspect, the intermediate layer is the welded layer which is formed by heating at least one surface of the aerogel layer. The "welded layer" is a layer which has been densified by closing the pores in the aerogel layer. The material(s) which constitutes the functional layer formed on the surface of the welded layer cannot penetrate into the aerogel layer since the formation of the welded layer closes the pores in the vicinity of the surface of the aerogel layer. The welded layer generally has a smooth surface, which also contributes to uniform formation of the functional layer.

In the first aspect according to the present invention, the fifth embodiment of the aerogel substrate is an aerogel substrate comprising an aerogel layer, a Langmuir-Blodgett film which is formed on at least one surface of the aerogel layer, and a functional layer which is formed on a surface of the Langmuir-Blodgett film. In the fifth embodiment of the first aspect, the intermediate layer is the Langmuir-Blodgett film. The Langmuir-Blodgett film fills or coats the pores in the surface of the aerogel layer and prevents the material(s) which constitutes the functional layer from penetrating into the aerogel layer when the functional layer is formed on the surface of the Langmuir-Blodgett film. The Langmuir-Blodgett film generally has a smooth surface, which also contributes to uniform formation of the functional layer.

In the first aspect according to the present invention, the sixth embodiment of the aerogel substrate is an aerogel substrate comprising an aerogel layer, an inorganic layered compound layer which is formed on at least one surface of the aerogel layer, and a functional layer which is formed on a surface of the inorganic layered compound layer. In the sixth embodiment of the first aspect, the intermediate layer is a layer of the inorganic layered compound. The inorganic layered compound layer fills or coats the pores in the surface of the aerogel layer and prevents the material(s) which constitutes the functional layer from penetrating into the aerogel layer when the functional layer is formed on the surface of the inorganic layered compound layer. The inorganic layered compound layer generally has a smooth surface, which also contributes to uniform formation of the functional layer.

In any aerogel substrate of the above first to sixth embodiments of the first aspect, the aerogel layer is preferably made of a silica aerogel.

By forming the functional layer as a layer which performs a desired function, it is possible to produce an aerogel substrate of the present invention as a desired functional substrate. The functional layer is, for example, an electrically conductive thin film, an infrared ray reflective thin film, an optical waveguide thin film, a transparent and electrically conductive thin film, or a fluorescent layer.

An aerogel substrate of which functional layer is the electrically conductive thin film can be used as a circuit board by forming a circuit pattern with the electrically conductive thin film. The electrically conductive material thereof is an electrically conductive metal which is selected from copper, aluminum, magnesium, silver and the like. The electrically conductive material is preferably copper from the viewpoints of electrical conductivity and cost. The circuit pattern is formed by subjecting the electrically conductive metal thin film to treatments including the photoresist formation, the masking, the exposure, the development and the etching.

In the case where the aerogel layer of the circuit board is a silica aerogel layer, the circuit board can be used as an excellent circuit board having a low dielectric constant and is useful as a substrate for a large-scale integrated circuit. This is because the silica aerogel has a very low dielectric constant of about 1.05 to about 2.0.

An aerogel substrate having the infrared ray reflective thin film can be used as a heat insulating substrate since the substrate can reflect infrared rays. The infrared ray reflective thin film is, for example, a thin film of aluminum or titania.

In the case where the aerogel layer of the heat insulating substrate is a silica aerogel layer, a thermal conductivity of the substrate is reduced, and therefore the aerogel substrate shows more excellent heat insulating properties. This is because the silica aerogel has a very low thermal conductivity of about 0.01 to 0.025 W/mK and a very low density.

An aerogel substrate having an optical waveguide thin film can be used as an optical waveguide substrate which transmits a light in a predetermined direction. In this aerogel substrate, a light is totally reflected at the interface between the aerogel layer and the optical waveguide thin film (such as a transparent thin film made of an inorganic oxide), and therefore the optical waveguide thin film functions as an optical waveguide path with a high optical transmission performance. The optical waveguide thin film is a transparent film having a large refractive index and made of a material for an optical fiber, such as silica.

In the case where a dense layer (e.g. film) is disposed as the intermediate layer between the optical waveguide thin film and the aerogel layer as in the aerogel substrates of the first embodiment and the third to sixth embodiments in the first aspect, a thickness of the intermediate layer is preferably 300 nm or less, and more preferably 100 nm or less. If the thickness of the layer is larger than a wavelength of the light to be transmitted, the light cannot be transmitted.

In the case where the aerogel layer of the optical waveguide substrate is a silica aerogel layer, a total reflectivity at the interface between the optical waveguide path and the aerogel layer is increased, and therefore the light transmission loss is considerably reduced even if the optical waveguide path is formed into a curved pattern. This is because the silica aerogel has a very low refractive index of 1.008 to 1.3.

The aerogel substrate having the transparent and electrically conductive thin film can be used as a substrate for a light emitting device. This transparent and crystal as well as a function of a touch panel. This is because a silica aerogel has a very low refractive index and the same optical function as that of air.

An aerogel substrate having the fluorescent layer can be used as a light emitting device. The light is emitted from the fluorescent layer by irradiation of an ultraviolet ray. Similarly to the light emitting device described above, where the aerogel layer is the silica aerogel layer, an external efficiency upon coupling out the light generated in the fluorescent layer can be increased. The fluorescent layer is made of, for example, an inorganic fluorescent material such as $Y_2O_3$:Eu (red), $LaPO_4$:Ce, Tb (green), $BaMgAl_{10}O_{17}$:Eu (blue) or the like, or an organic fluorescent material such as a low molecular weight dye material, a conjugated polymer material or the like.

Each layer described above is an example of the preferred functional layer. The functional layer may perform other function. Further, the term "functional layer" is used in the sense of including a layer which gives a desired property to the substrate comprising the aerogel layer and provides a certain effect. For example, the functional layer includes a colored thin film which is formed so as to give a decorative effect to the surface of the aerogel layer.

In the second aspect, the present invention provides a electrically conductive thin film can be made of a transparent and electrically conductive material selected from indium-tin oxide (ITO), indium-zinc oxide (IXO), silver, chromium and so on. The aerogel substrate having the transparent and electrically conductive thin film can constitute, for example, an EL light emitting device. The EL light emitting device is formed by providing an EL (electroluminescence) layer on a surface of the transparent and electrically conductive thin film of the aerogel substrate and providing a back metal electrode on a surface of the EL layer. The EL layer can be made of a luminescent material conventionally used in the organic EL or inorganic EL. The light is emitted from the EL layer by applying an electric field between the transparent and electrically conductive thin film and the back metal electrode. This EL light emitting device can be used for various kinds of displays.

The light emitting device in which the aerogel layer is a silica aerogel layer can be used as an EL light emitting device of which external efficiency upon coupling out the light generated in the EL layer is high. This is because the silica aerogel has a very low refractive index of 1.008 to 1.3. Further, the light emitting device comprising the silica aerogel layer make it possible to produce a display having a function of protection of a front light for a reflective liquid process for producing the aerogel substrate in the first aspect according to the present invention.

The process for producing the aerogel substrate of the present invention comprises the steps of:

forming an intermediate layer on at least one surface of an aerogel layer; and forming a functional layer on a surface of the intermediate layer, said intermediate layer being a layer which prevents a material(s) which constitutes the functional layer from penetrating into the aerogel layer.

The aerogel substrates of the first embodiment and the third to the sixth embodiments provided by the present invention in the first aspect, can be produced by forming the intermediate layer according to the following methods.

The process for producing the aerogel substrate of the first embodiment in the first aspect comprises the steps of:
- forming a hydrophilic layer by subjecting at least one surface of a hydrophobic aerogel layer to a plasma treatment or a UV ozone treatment;
- forming a coating layer by coating a surface of the hydrophilic layer with an aqueous solution and/or an aqueous dispersion of a film-forming component(s) followed by drying the solution and/or the dispersion; and
- forming a functional layer on a surface of the coating layer.

This production process is characterized in that the step of forming the intermediate layer comprises the step of forming the hydrophilic layer by subjecting at least one surface of the hydrophobic aerogel layer to the plasma treatment or the UV ozone treatment; and forming the coating layer by coating the surface of the hydrophilic layer with the aqueous solution and/or the aqueous dispersion of the film-forming component(s) followed by drying the solution and/or the dispersion.

According to this production process, a surface which is suitable for forming the functional layer uniformly thereon is provided by forming the coating layer on the surface of the hydrophobic aerogel layer, and the hydrophilicizing treatment of the hydrophobic aerogel layer makes it possible to form the coating layer on the surface thereof.

The coating layer is formed by coating the surface of the hydrophilic layer with the aqueous film-forming component(s) solution and/or the aqueous film-forming component(s) dispersion followed by drying the solution and/or the dispersion. "Film-forming component" is a component which constitutes a film after a solution or a dispersion containing the component is coated and thereafter dried to remove a solvent. As "the aqueous solution and/or the aqueous dispersion of the film-forming component(s)", are listed a) an aqueous solution of the film-forming component(s), b) an aqueous dispersion of the film-forming component(s), and c) a fluid containing at least two film-forming components, at least one component being dissolved in water and at least one other component being dispersed in water.

The aerogel represented by the silica aerogel is porous. When a liquid substance is applied onto the aerogel, the liquid substance easily penetrates into the aerogel due to the capillarity, whereby the microporous structure of the aerogel may be broken resulting deterioration of the properties of the aerogel. For the aerogel which has not been to subjected to the hydrophobing treatment, its microporous structure is broken when either of a water-based liquid substance or an oil-based liquid substance penetrates therein. It is substantially impossible to form a film on such aerogel by applying a liquid for coating.

On the other hand, for the hydrophobic aerogel, i.e. an aerogel to which hydrophobicity has been imparted, the microporous structure is not broken by the penetration of the water-based liquid, although the microporous structure is broken by the penetration of the oil-based liquid substance. Therefore, no break of the microporous structure is caused even if a film is formed on the surface of the hydrophobic aerogel using the water-based liquid for coating (i.e. an aqueous solution and/or an aqueous dispersion of the film-forming component(s)) according to the conventional coating method (for example, the spin coating method). However, it is actually difficult to apply the water-based liquid for coating uniformly on the surface of the hydrophobic aerogel since hydrophobic organic groups which repel the aqueous solution and/or the aqueous dispersion are bound to the surface of the hydrophobic aerogel.

In the process for producing the aerogel substrate of the first embodiment in the first aspect, the organic hydrophobic groups on the surface of the aerogel are removed by subjecting the surface of the hydrophobic aerogel layer to the plasma treatment or the UV ozone treatment while its hydrophobicity is maintained in the inside. By the removal of the hydrophobic groups, a hydrophilic layer is formed in the surface of the aerogel layer, and thereby the aqueous solution and/or the aqueous dispersion of the film-forming component(s) as the liquid for coating can be applied uniformly onto the surface of the aerogel layer and a film-like coating layer is formed after drying to remove water. The coating layer fills or coats the pores in the surface of the aerogel layer and preferably has a smooth surface. There is no case where the aqueous solution and/or the aqueous dispersion penetrates inside to break the microporous structure since the inside of the aerogel layer remains hydrophobic.

The plasma treatment can be carried out by a known method conventionally used for carrying out surface cleaning or the like.

The UV ozone treatment also can be carried out by a known method. Concretely, the treatment is carried out by a method in which the oxygen in the air is ozonized by irradiation of ultraviolet rays to produce oxygen radicals and the aerogel surface is etched and cleaned with the radicals.

The plasma treatment or the UV ozone treatment is preferably carried out such that the thickness of the hydrophilic layer in which the hydrophobic groups in the aerogel have been removed is in the range of 50 nm to 100 $\mu$m.

The process for producing the aerogel substrate of the third embodiment in the first aspect comprises the steps of:
- forming an inorganic layer or an organic layer by a gas phase method on at least one surface of an aerogel layer; and
- forming a functional layer on a surface of the inorganic layer or the organic layer.

This production process is characterized in that the step of forming the intermediate layer comprises the step of forming the inorganic layer or the organic layer by the gas phase method on at least one surface of the aerogel layer.

The gas phase method (or a vapor growth method) is a method for forming a film by evaporating a film-forming material(s) in vacuum or forming a plasma material(s) in vacuum followed by depositing such material(s) on a surface of an object (i.e. the aerogel layer in the present invention) to form a film. Concretely, a CVD (Chemical Vapor Deposition) method, a sputtering method, or a vapor deposition (vacuum deposition) can be employed as the gas phase method.

The inorganic layer or the organic layer which coats or fills the pores in the surface of the aerogel layer is formed by the gas phase method. The smoothness of the surface of the inorganic layer or the organic layer can be improved by appropriately selecting conditions of the gas phase method. The formation of the inorganic layer or the organic layer by means of the gas phase method does not cause the break of the microporous structure of the aerogel since the gas phase method is a dry process which does not involve coating a liquid substance followed by drying the substance. Therefore, this production process can be applied to both of the hydrophobic aerogel or the aerogel which has not been subjected to the hydrophobing treatment.

The thickness of the inorganic layer or the organic layer formed by the gas phase method is preferably 50 nm to 100 $\mu$m.

The process for producing the aerogel substrate of the fourth embodiment in the first aspect comprises the steps of:

forming a welded layer by heating at least one surface of an aerogel layer; and forming a functional layer on a surface of the welded layer.

This production process is characterized in that the step of forming the intermediate layer comprises the step of forming the welded layer by heating at least one surface of the aerogel layer.

An annealing treatment in which at least one surface of the aerogel layer is heated results in closing the pores in the vicinity of the surface of the aerogel layer, and thereby a dense intermediate layer which is not porous is formed. Heating the aerogel layer is carried out by placing the aerogel layer in a high temperature furnace for several tens of seconds, or by irradiation of heat rays onto the surface for short period of time. In any method, heating is preferably carried out such that the thickness of the welded layer is in the range of 50 nm to 100 $\mu$m. This production process can be applied to both of a hydrophobic aerogel or an aerogel which has not been subjected to the hydrophobing treatment since this method does not involve coating a solution and so on upon making the surface of the aerogel layer smooth.

The process for producing the aerogel substrate of the fifth embodiment in the first aspect comprises the steps of:

forming a thin film on at least one surface of an aerogel layer by the Langmuir-Blodgett method; and forming a functional layer on a surface of the thin film.

This production process is characterized in that the step of forming the intermediate layer comprises the step of forming the thin film on at least one surface of the aerogel layer by the Langmuir-Blodgett method.

In this production process, the thin film as the intermediate layer is formed on a surface of the porous aerogel layer by the Langmuir-Blodgett method, which film coats or fills the pores in the surface of the aerogel layer. The Langmuir-Blodgett method (which is referred to also as "LB method") is a method for forming a thin film in which method a polymer membrane is formed on a water surface by spreading a polymer solution which is insoluble into water; the surface of the aerogel layer is contacted with the polymer membrane at an appropriate surface pressure; and thereby the polymer membrane is transferred from the water surface to the surface of the aerogel.

The thickness of the thin film formed by the LB method is within a monomolecular level, and therefore, the LB method makes it possible to form a very thin film having a thickness of several nanometers or others within the same order. Further, the film thickness can be controlled by the nanoscale by varying a length of a side-chain of the polymer. Furthermore, as described below, by a built-up technique for building up a polymer thin film on the surface of the aerogel layer such as a vertical dipping method or a horizontal dipping method, a built-up film structure and properties of the film surface can be changed. Upon forming the polymer thin film by the LB method, as the polymer, a polymer having an amphipatic property which is selected from a polyimide, a polyalkylacrylate, a polyester, a polyvinylacetal, a polyglutamate and so on can be used.

The process for producing the aerogel substrate of the sixth embodiment in the first aspect comprises the steps of:

forming an inorganic layered compound layer by having at least one surface of an aerogel layer adsorb an inorganic layered compound; and forming a functional layer on a surface of the inorganic layered compound layer.

This production process is characterized in that the step of forming the intermediate layer comprises the step of forming the inorganic layered compound layer by having at least one surface of the aerogel layer adsorb the inorganic layered compound.

In this production process, the surface of the aerogel layer on which the functional layer is formed is coated with the inorganic layered compound layer. The inorganic layered compound layer coats or fills the pores in the surface of the aerogel layer to prevent the material(s) which constitutes the functional layer formed on its surface from penetrating into the aerogel layer. Generally, the inorganic layered compound layer provides a smooth surface to ensure that the functional layer is formed more uniformly. The inorganic layered compound layer is formed by contacting the surface of the porous body with a treatment liquid which includes the inorganic layered compound dispersed in a solvent, and thereby having the surface of the aerogel layer adsorb the inorganic layered compound. "Adsorb" means forming the inorganic layered compound layer without involving the solvent of the treatment liquid in which the inorganic layered compound is dispersed in the formation of the inorganic layered compound layer in the course of the formation of the layer on the surface of the object (i.e. the aerogel layer in the present invention). This production process can be applied to both of a hydrophobic aerogel and an aerogel which has not been subjected to the hydrophobing treatment since this process does not require the application of a liquid substance on the surface of the aerogel layer.

In any one of the production processes described above, the functional layer is formed by a coating method or a gas phase method.

The coating method is a method for forming a film by coating a surface of an object with a liquid in which a film-forming component(s) is dissolved and/or dispersed in a solvent followed by drying the liquid to remove the solvent. The coating method is a conventional film forming method. Concretely, the spin coating method, the dip coating method, the spray coating method, the bar coating method and the like are known.

The gas phase method is the same as described with respect to the production process of the aerogel substrate of the third embodiment in the first aspect. The gas phase method makes it possible to control the thickness of the layer to be formed to a very thin thickness (for example, several hundreds of nanometers). Such control cannot be achieved by the coating method.

In the third aspect, the present invention provides a process for producing the aerogel substrate of the second embodiment in the first aspect.

The process for producing the aerogel substrate of the second embodiment in the first aspect comprises the steps of:

forming a hydrophilic layer by subjecting at least one surface of a hydrophobic aerogel layer to a plasma treatment or a UV ozone treatment; and forming a functional layer by coating a surface of the hydrophilic layer with an aqueous solution and/or an aqueous dispersion of a film-forming component(s) followed by drying the solution and/or the dispersion.

This production process is characterized in that the step of forming the intermediate layer comprises the step of forming the hydrophilic layer by subjecting at least one surface of the hydrophobic aerogel layer to the plasma treatment or the UV ozone treatment.

This production process is a variation of the production process of the aerogel substrate of the first embodiment in the first aspect wherein the functional layer is formed directly on the surface of the hydrophilic layer without forming the coating layer. This production process can be applied when the functional layer is formed by applying the aqueous solution and/or the aqueous dispersion of the film-forming component(s) followed by drying the solution and/or the dispersion. The aqueous solution and/or the aqueous dispersion which is used in forming the functional layer contains a component(s) as the film-forming component(s) which gives a desired function to the substrate. For example, a transparent and electrically conductive thin film can be formed as the functional layer by coating the surface of the hydrophilic layer with an aqueous solution and/or an aqueous dispersion containing indium-tin oxide as the film-forming component followed by drying the solution and/or the dispersion.

EMBODIMENTS FOR CARRYING OUT THE INVENTION

Figure 1:
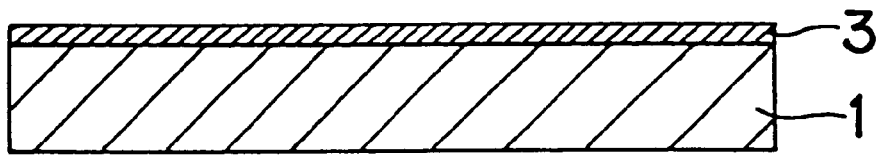
FIGS. 1(a), 1(b) and 1(c) are respectively cross-sectional views which schematically show merely examples of the aerogel substrate according to the present invention.
Figure 1:
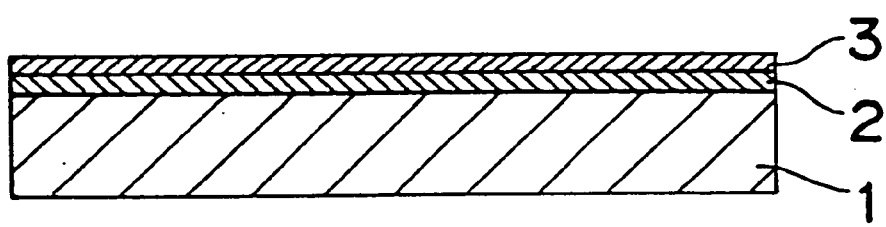
Figure 1:
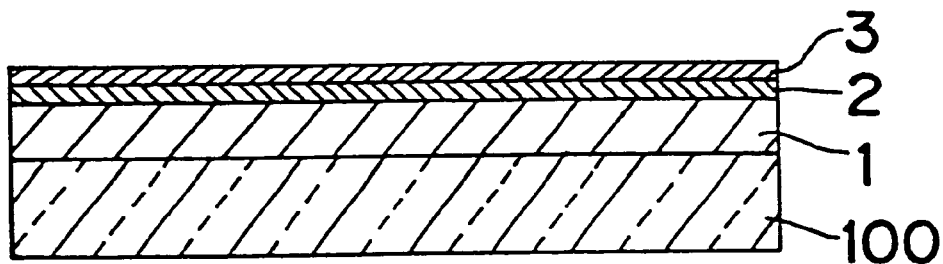

The embodiments of the present invention will be explained below.

The aerogel which constitutes the aerogel substrate of the present invention includes a gel which is obtained by a supercritical drying of a wet gel, and a gel which is obtained by drying a wet gel under subcritical conditions and has a similar structure (generally, a porosity) to that of the gel which is obtained by the supercritical drying. The aerogel has preferably at least 40% of porosity, more preferably at least 60% of porosity, and furthermore preferably at least 80% of porosity. The aerogel is preferably a silica aerogel.

The silica aerogel can be produced by obtaining a gel having a silica framework in a wet state by means of hydrolysis followed by polymerization of an alkoxysilane (which is referred to also as a silicon alkoxide or an alkyl silicate) and drying the gel in the presence of a solvent (or a dispersion medium) such as an alcohol or carbon dioxide under supercritical conditions exceeding a critical point of the solvent, as described in U.S. Pat. Nos. 4,402,927, 4,432,956 and 4,610,863. For example, the supercritical drying may be carried out by dipping the polymerized wet gel in liquefied carbon dioxide so that all of the solvent which the gel contains therein is replaced with the liquefied carbon dioxide of which critical point is lower than that of the solvent, followed by removing carbon dioxide under the supercritical conditions. Alternatively, the supercritical drying is carried out by replacing a part of the solvent which is contained in the gel with the liquefied carbon dioxide, followed by removing the solvent and carbon dioxide under the supercritical conditions of the solvent and carbon dioxide system.

Alternatively, the silica aerogel is produced using sodium silicate as a starting material in the same manner as the above, as described in U.S. Pat. Nos. 5,137,927 and 5,124,364.

The silica aerogel is preferably one to which hydrophobicity has been imparted, i.e. the hydrophobic silica aerogel.

It is difficult for moisture and water to go into the inside of the hydrophobic silica aerogel, and thus, degradation of the properties of the silica aerogel such as the refractive index, the light transparency and so on is prevented.

The hydrophobicity can be imparted to the silica aerogel by subjecting the gel compound obtained by the hydrolysis and polymerization of the alkoxysilane to a hydrophobing treatment, as disclosed in Japanese Patent Kokai Publication Nos. 5-279011 and 7-138375.

The hydrophobing treatment may be carried out before or during the supercritical drying of the gel compound. The hydrophobing treatment is carried out by reacting hydroxyl groups of silanol groups which are on the surface of the gel compound with hydrophobic groups of an agent for the hydrophobing treatment so that the hydroxyl groups are replaced with the hydrophobic groups of the agent. Concretely, for example, the reaction for replacing the hydroxyl groups with the hydrophobic groups is carried out by dipping the gel compound into a hydrophobing treatment liquid containing a solvent in which the hydrophobing treatment agent has been dissolved, so that the hydrophobing treatment agent can penetrate into the gel, followed by heating if necessary.

As the hydrophobing treatment agent, for example hexamethyldisilazane, hexamethyldisiloxane, trimethylmethoxysilane, dimethyldimethoxysilane, methyltrimethoxysilane, ethyltrimethoxysilane, trimethylethoxysilane, dimetyldiethoxysilane, metyltriethoxysilane and so on are exemplified. There is no particular limitation as to the solvent used for the hydrophobing treatment as long as the solvent easily dissolves the hydrophobing treatment agent and also is able to be replaced with the solvent that the gel material contains before the hydrophobing treatment. As the solvent which is used for the hydrophobing treatment, for example methanol, ethanol, isopropanol, xylene, toluene, benzene, N,N-dimethylformamide, hexamethyidisiloxane and the like may be used. In the case where the supercritical drying is carried out later on, the solvent is preferably one which is easily dried by the supercritical drying, such as methanol, ethanol, isopropanol, liquefied carbon dioxide or the like, or other solvent which is able to be replaced with one of those listed solvents.

The refractive index of the silica aerogel is very small since its porosity is large. Therefore, the aerogel layer made of the silica aerogel is particularly preferably used where the aerogel substrate is a substrate for a light emitting device of which functional layer is a transparent and electrically conductive thin film or for a light emitting device of which functional layer is a fluorescent layer.

The aerogel other than the silica aerogel is a porous material which is obtained by forming a wet gel of a melamine resin followed by the supercritical drying thereof as described in U.S. Pat. No. 5,086,085.

As the gel which is obtained by drying the wet gel under the subcritical conditions and has the similar structure to that of the gel which is obtained by the supercritical drying, a porous silica (xerogel) is exemplified which is obtained by means of normal heating or vacuum to dry a wet gel which is obtained by hydrolysis and polymerization of an alkoxysilane or a gelation reaction of sodium silicate. Japanese Patent Kohyo Publications Nos. 8-505674 and 10-508569 disclose a silica which is produced by drying under the subcritical conditions and has a porosity similar to that of the silica prepared by the supercritical drying. Such silica is preferably used in the present invention. The porous silica may be one which has been subjected to the hydrophobing treatment as described in U.S. Pat. No. 5,830,387.

Further, a porous material of, for example, a polymethylmethacrylate resin can be used in place of the aerogel which porous material is obtained by preparing a resin mixture of a polystyrene resin and a polymethylmethacrylate resin and then selectively removing the polystyrene resin by means of its dissolution as described in "SCIENCE", Vol. 283, 1999, p 520.

The U.S. Patents, the Japanese Patent Kokai Publications, Japanese Patent Kohyo Publications and the technical reference referred to in the above as to the production process and the hydrophobing treatments of the aerogel are incorporated in the present specification with the references thereto.

It is difficult to handle the aerogel alone in the form of a sheet or a board unless the thickness thereof is at least several millimeters since the strength of the aerogel is very small. Therefore, the aerogel substrate of the present invention may be in the form of a laminate in which the aerogel layer is laminated on a plate member. The plate member is appropriately selected depending on the function which is achieved by the aerogel substrate as long as the plate member ensures the strength of the substrate as a whole. The plate member has predetermined optical properties (such as a refractive index and transparency) if the aerogel substrate becomes a light emitting device or a substrate for the light emitting device. The plate member may be, for example, a glass plate.

The aerogel layer may be formed on a surface of the plate member for example according to the following procedures:

(1) An alkoxysilane solution prepared by mixing an alkoxysilane, water, a catalyst such as ammonia, and a solvent, is applied on a surface of the plate member;

(2) A gel in the form of a thin film is formed by hydrolysis and polymerization of the alkoxysilane, and the gel is subjected to the hydrophobing treatment if necessary; and (3) The gel laminated on the plate member is subjected to the supercritical drying.

Then, concrete embodiments of the aerogel substrates of the present invention are described together with the production processes thereof.

Firstly, the aerogel substrate of the first embodiment in the first aspect, i.e. the aerogel substrate in which the aerogel layer is the hydrophobic aerogel layer; the intermediate layer consists of the hydrophilic layer which is formed by subjecting at least one surface of the hydrophobic aerogel layer to the hydrophilicizing treatment and the coating layer which is formed on the surface of the hydrophilic layer; and the functional layer is formed on the surface of the coating layer, is explained.

"At least one surface" of the hydrophobic aerogel layer to be subjected to the hydrophilicizing treatment is usually one of two surfaces of the hydrophobic aerogel layer which are vertical to the direction of the thickness of the aerogel layer. When the hydrophobic aerogel layer is laminated on a surface of a plate member, the surface of the aerogel layer which surface is opposite to the surface in contact with the plate member is generally subjected to the hydrophilicizing treatment. In the case where the hydrophobic aerogel layer is thick and, for example, in the form of a rectangular solid or a cube, a surface(s) which is parallel to the direction of the thickness may be subjected to the hydrophilicizing treatment. Two or more surfaces may be subjected to the hydrophilicizing treatment. For example, when the hydrophobic aerogel layer is not laminated on a plate member and used alone, two surfaces vertical to the direction of the thickness may be subjected to the hydrophilicizing treatment. Alternatively, one surface vertical to the direction of the thickness of the hydrophobic aerogel layer and one surface parallel to the direction of the thickness may be subjected to the hydrophilicizing treatment.

In the hydrophilic layer which is formed on at least one surface of the hydrophobic aerogel layer, the hydrophobic groups of the aerogel have been removed. Such hydrophilic layer is formed by subjecting at least one surface of the hydrophobic aerogel layer to the plasma treatment or the UV ozone treatment.

The plasma treatment is preferably so carried out that the hydrophobic groups are removed in the portion from the surface of the hydrophobic aerogel layer to a level of a depth of 50 nm to 100 $\mu$m. For this purpose, the plasma treatment is carried out by injecting a plasma from a plasma injecting nozzle onto the surface of the hydrophobic aerogel layer using a plasma treatment apparatus such as an atmospheric pressure plasma cleaning apparatus (manufactured by Matsushita Electric Works, Ltd., trade name "Aiplasma")with the nozzle spaced by about 7 mm apart from the surface of the hydrophobic aerogel layer. The plasma is, for example a plasma of one or more gases selected from helium, argon and oxygen. Such plasma may be generated using, for example, an electric power of 700 to 800 W. The surface of the hydrophobic aerogel layer is preferably subjected to the plasma treatment for 0.1 to 2 seconds.

The UV ozone treatment is also preferably carried out such that the hydrophobic groups are removed in the portion from the surface of the hydrophobic aerogel layer to a level of a depth of 50 nm to 100 $\mu$m. Concretely, the UV ozone treatment is carried out by applying a UV ray from a UV light source such as an excimer lamp onto the surface of the hydrophobic aerogel layer in an oxygen atmosphere or the air. The time for which the UV is applied onto the surface of the hydrophobic aerogel layer depends on the power of the UV light source and so on, and it is generally in the range of 10 seconds to 1 minute.

The coating layer formed on the surface of the hydrophilic layer is provided to fill the pores in the surface of the hydrophobic aerogel layer so that the material(s) which constitutes the functional layer is prevented from penetrating into the aerogel layer when the functional layer is formed on the surface of the coating layer. The coating layer also removes surface unevenness due to the pores and provides the smooth surface which is suitable for forming the functional layer thereon.

The coating layer is formed by coating the surface of the hydrophilic layer with the aqueous solution and/or the aqueous dispersion of the film-forming component(s) followed by drying the solution and/or the dispersion. The aqueous solution and/or the aqueous dispersion of the film-forming component(s), i.e. an aqueous fluid for coating is prepared by so adjusting the viscosity and so on that the film-forming component(s) uniformly covers the surface of the aerogel to fill the pores in the surface uniformly after the fluid is applied and dried. Concretely, an aqueous solution of a water-soluble polymer such as a polyvinyl alcohol or a polyethylene oxide is preferably used. The concentration of the water-soluble polymer is preferably 0.1 to 5% by mass.

Further preferably, the aqueous solution of the water-soluble polymer contains fine particles of silica. In the case where the fine particles of silica are contained as the film-forming component in the aqueous solution, the pores which exist on the surface of the hydrophobic aerogel layer are filled with more densely packed fine particles, and thereby a more smooth surface is provided after the formation of the film. The aqueous solution of the water-soluble polymer containing the fine particles of silica is obtained by dispersing a silica sol in the aqueous solution. The content of the silica sol is preferably in the range of 5 to 50% by mass, but not limited thereto. The silica sol may be dispersed in an aqueous solution or an aqueous dispersion other than the aqueous solution of the water-soluble polymer.

The aqueous fluid for coating may be applied by the conventional method such as the spin coating method, the dip coating method, the spray coating method, the bar coating method or the like. After the application, the aqueous fluid for coating may be dried with a drier or may be air-dried.

The thickness of the coating layer which is formed after drying the aqueous fluid for coating is preferably 50 nm to 100 μm.

The coating layer fills the surface pores of the aerogel layer and provides the smooth surface. Therefore, the functional layer can be formed on the surface of the coating layer uniformly, and thereby it can perform its function sufficiently.

The functional layer is, for example, the electrically conductive thin film, the infrared ray reflective thin film, the optical waveguide thin film, the transparent and electrically conductive thin film, or the fluorescent layer. Materials for and thickness of the functional layer are so selected that the aerogel substrate as a final product can perform a desired function. The method for forming the functional layer is selected from the gas phase method and the coating method depending on the materials for and the thickness of the functional layer.

For example, the electrically conductive thin film may be formed by, for example the vacuum deposition or the sputtering of an electrically conductive metal such as copper. Generally, the thickness of the electrically conductive thin film is preferably about 50 to about 200 nm.

The infrared ray reflective thin film may be formed by, for example the sputtering or the vacuum deposition of aluminum or titania. Generally, the thickness of the infrared ray reflective thin film is preferably about 50 to about 200 nm.

The optical waveguide thin film is, for example, a silica thin film formed by the CVD method. The optical waveguide thin film may be formed in a desired pattern. The thickness of the optical waveguide film is, for example, about 50 to about 100 nm.

The transparent and electrically conductive thin film may be formed by the sputtering or the ion plating of ITO, IXO, silver, chromium or the like. Generally, the thickness of the transparent and electrically conductive thin film is preferably about 0.1 to about 1 μm.

The fluorescent layer may be formed by the vacuum deposition of the organic fluorescent material such as a low molecular weight dye material, or the layer may be formed by applying a fluid for coating which is prepared by dispersing a binding agent and an inorganic fluorescent material such as $Y_2O_3$:Eu in pure water or an organic solvent, followed by drying. Generally, the thickness of the fluorescent layer is preferably about 0.1 to about 10 μm.

Examples of the aerogel substrates of which intermediate layer is the hydrophilic layer and the coating layer are schematically shown in FIGS. 1(b) and 1(c). In the aerogel substrate shown in FIG. 1(b), the coating layer (2) is formed on a surface of the hydrophilic layer (not shown) which has been formed by subjecting one surface of the plate-like aerogel layer (1) to the hydrophilicizing treatment and the functional layer (3) is formed on the surface of the coating layer (2). The aerogel substrate shown in FIG. 1(c) is one in which the aerogel layer (1) is formed into a thin film on the plate member (100) which is, for example, a glass plate, and the coating layer (2) and the functional layer (3) are formed on the surface of the aerogel layer (1) in thus listed order.

Then, the aerogel substrate of the second embodiment in the first aspect, i.e. the aerogel substrate in which the aerogel layer is the hydrophobic aerogel layer; the intermediate layer is the hydrophilic layer which is formed by subjecting at least one surface of the hydrophobic aerogel layer to the hydrophilicizing treatment; and the functional layer is formed on the surface of the hydrophilic layer, is explained.

This aerogel substrate corresponds to the aerogel substrate of the first embodiment in the first aspect in which the coating is formed as the functional layer. In order to form the functional layer, it is necessary to select the film-forming component(s) so that a desired function is imparted to the film. For example, a transparent and electrically conductive thin-film is formed by selecting indium-tin oxide as the film-forming component. The aqueous fluid for coating which contains indium-tin oxide is obtained by adding a sol or a powder of indium-tin oxide fine particles into an aqueous solution of a polyvinyl alcohol or a polyethylene oxide or the like. A circuit board having the transparent and electrically conductive material thin film formed by application of the aqueous fluid for coating containing indium-tin oxide, can be sufficiently practical depending on its application although its electroconductivity tends to be smaller than that in the circuit board having an indium-tin oxide thin film formed by the gas phase method such as the sputtering.

One example of the aerogel substrate in which the intermediate layer is the hydrophilic layer and the functional layer is formed on the surface of the hydrophilic layer is schematically shown in FIG. 1(a). The aerogel substrate shown in FIG. 1(a) is one in which the hydrophilic layer (not shown) is formed by subjecting one surface of the plate-like aerogel layer (1) to the hydrophilicizing treatment and the functional layer (3) is formed directly on the surface of the hydrophilic layer.

Then, the aerogel substrate of the third embodiment in the first aspect, i.e. the aerogel substrate in which the intermediate layer is the inorganic layer or the organic layer formed by the gas phase method is explained. The meaning of "at least one surface" is the same as described above in connection with the aerogel substrate of the first embodiment in the first aspect, and therefore the detailed explanation thereof is omitted here.

As described above, since the gas phase method is a dry process, the aerogel layer which constitutes the aerogel substrate of the third embodiment in the first aspect may be one which has been subjected to the hydrophobing treatment or one which has not been subjected to the hydrophobing treatment. Preferably, the aerogel layer has been subjected to the hydrophobing treatment from a viewpoint of its durability. When the aerogel substrate is used as a substrate for an electronic device or an EL (electroluminescence) device, it is generally used in a sealed condition for dampproofing, and therefore the aerogel does not need to have been subjected to the hydrophobing treatment.

The film formed by the gas phase method is provided to fill the pores in the surface of the aerogel layer and preferably to further give a smooth surface. The material which constitutes the film is either an organic material or an inorganic material. Preferably, the material produces precipitated particles which are smaller. It is necessary to form the film such that a residual energy in the film after the film formation is small. When the residual energy after the film formation is large, there occurs a case where peeling of the film happens. The conditions for forming the film by the gas phase method are appropriately selected depending on the properties of the film-forming material(s) and the aerogel layer. For example, when it is desired to reduce the residual energy or when the film is formed with the organic material, it is preferable that a film formation temperature is low and the plasma energy is low. If densification of the film is difficult because of the low film formation temperature, the film may be formed at a higher temperature.

The inorganic layer formed by the gas phase method is preferably made of a material selected from $SiO_2$, SiN, SiON and $TiO_2$, and more preferably made of $SiO_2$ (silica). The layer of silica is preferably formed by the sputtering method or the CVD method. When the layer of silica is formed as a thin film by the sputtering method, the film formation temperature is preferably 20° C. to 400° C., and more preferably 150° C. to 250° C. When the layer of silica is formed by the CVD method, it is preferable that the layer is formed using tetraethoxysilane as a starting material at 100° C. to 400° C., and more preferably at 100° C. to 200° C.

The thickness of the inorganic layer is preferably 50 nm to 100 μm and more preferably 50 nm to 1 μm.

The organic layer formed by the gas phase method is preferably prepared by the vacuum deposition. The organic layer can be formed by the vacuum deposition of, for example, copper phthalocyanine, aluminum-quinolinol complex, or the like. A molecular weight of the organic compound for forming the organic layer is preferably smaller in order that the temperature during the vapor deposition is low. When the organic layer is formed by the vapor deposition, the aerogel has preferably been subjected to the hydrophobing treatment. The hydrophobicity of the aerogel improves adhesion between the organic layer and the aerogel layer, and allows the pores in the surface of the aerogel layer to be filled well (i.e. more densely).

The thickness of the organic layer is preferably 50 nm to 100 μm and more preferably 50 nm to 1 μm.

The functional layer is formed on the surface of the inorganic layer or the organic layer formed by the gas phase method. The inorganic or organic layer provides a smooth surface by filling the pores in the surface of the aerogel layer, and thereby the functional layer is formed uniformly thereon and performs its function effectively. The functional layer is the same as described above in connection with the aerogel substrate of the first embodiment in the first aspect, and therefore the detailed explanation thereof is omitted here.

The construction of the aerogel substrate of the third embodiment in the first aspect is as shown in FIGS. 1(b) and 1(c). When the aerogel substrate of the third embodiment in the first aspect has the construction as shown in FIG. 1(b), the inorganic layer or the organic layer formed by the gas phase method is the layer denoted by the numeral "2", and the functional layer is the layer which is formed on the surface of the layer (2) and denoted by the numeral "3". When the aerogel layer is formed on a surface of a plate member such as a glass plate, the aerogel substrate has the construction as shown in FIG. 1(c) in which the aerogel layer (1) as a thin film, the inorganic layer or the organic layer (2) formed by the gas phase method, and the functional layer (3) are laminated in thus listed order on the surface of the plate member (100).

The aerogel substrate of the fourth embodiment in the first aspect comprises the aerogel layer, the welded layer which is formed by heating at least one surface of the aerogel layer, and the functional layer which is formed on the surface of the welded layer. The meaning of "at least one surface" is the same as described above in connection with the aerogel substrate of the first embodiment in the first aspect, and therefore the detailed explanation thereof is omitted here.

The welded layer is formed by the annealing treatment in which the surface of the aerogel layer is heated. The annealing treatment closes the pores in the surface layer of the aerogel, and thereby the surface of the aerogel layer becomes dense and smooth suitable for forming the functional layer thereon. The annealing treatment is so carried out that only a surface layer portion of the aerogel layer is sintered, and the conditions of the treatment are appropriately selected depending on a kind and a dimension of the aerogel. For example, in the case where the aerogel is a silica aerogel, the annealing treatment is carried out by placing the silica aerogel into a high-temperature furnace at about 600° C. to about 1000° C. for several tens of seconds or by applying heat rays onto the surface of the silica aerogel layer for a short period of time.

The thickness of the welded layer is preferably 50 nm to 100 μm.

The functional layer is formed on the surface of the welded layer. The welded layer provides a dense and smooth surface without pores, and thereby the functional layer is formed uniformly thereon and performs its function effectively. The functional layer is the same as described above in connection with the aerogel substrate of the first embodiment in the first aspect, and therefore the detailed explanation thereof is omitted here.

The aerogel a portion of which becomes the welded layer does not need to be hydrophobic. However, it is preferably hydrophobic from the viewpoint of its durability.

The construction of the aerogel substrate of the fourth embodiment in the first aspect is the same as that of the aerogel substrate of the second embodiment in the first aspect, and has a construction, for example, as shown in FIG. 1(a). When the aerogel substrate of the fourth embodiment in the first aspect has the construction as shown in FIG. 1(a), the functional layer (3) is formed directly on the surface of the welded layer (not shown) which has been formed by heating one surface of the plate-like aerogel layer (1).

The aerogel substrate of the fifth embodiment in the first aspect comprises the aerogel layer, the Langmuir-Blodgett film which is formed on at least one surface of the aerogel layer, and the functional layer which is formed on the surface of the Langmuir-Blodgett film. The meaning of "at least one surface" is the same as described above in connection with the aerogel substrate of the first embodiment in the first aspect, and therefore the detailed explanation thereof is omitted here.

As described above, the method for forming the polymer thin film by the LB method includes the vertical dipping method and the horizontal dipping method. In the case where the polymer thin film is formed by the vertical dipping method, the aerogel which has been subjected to the hydrophobing treatment is used in order to prevent break of the microporous structure of the aerogel layer when it is dipped into water. According to the horizontal dipping method, the polymer thin film can be formed without contacting the aerogel layer with water. Therefore, when the horizontal dipping method is employed, the aerogel layer may be a hydrophilic aerogel layer. However, in order to prevent the break of the microporous structure of the aerogel layer due to accidental contact between water and the aerogel layer, the aerogel which has been subjected to the hydrophobing treatment is preferably used also when the horizontal dipping method is applied. In any method, the aerogel layer which has been subjected to the hydrophobing treatment may be the one of which surface has been subjected to the hydrophilicizing treatment.

Figure 2:
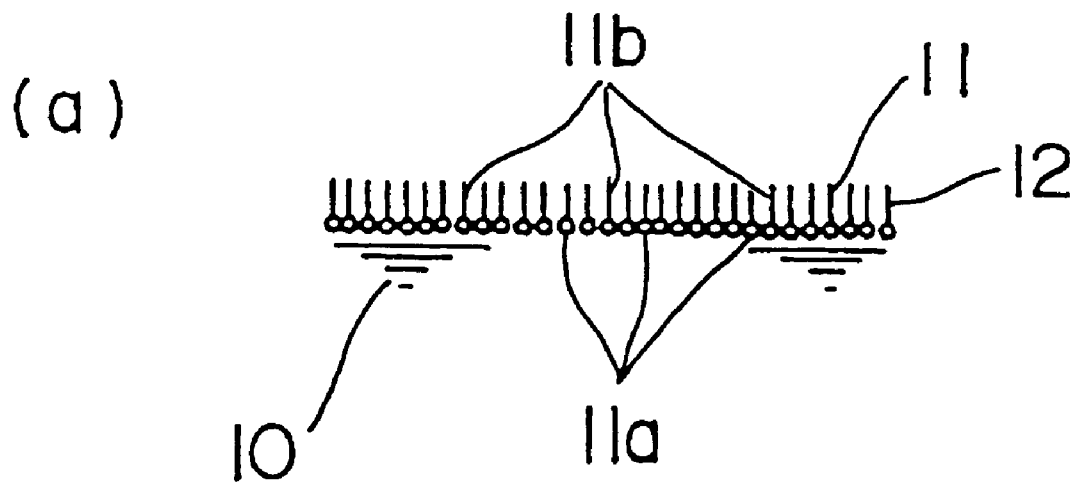
FIGS. 2(a) and 2(b) schematically show a process for forming a thin film on a surface of an aerogel layer by the LB method.
Figure 2:
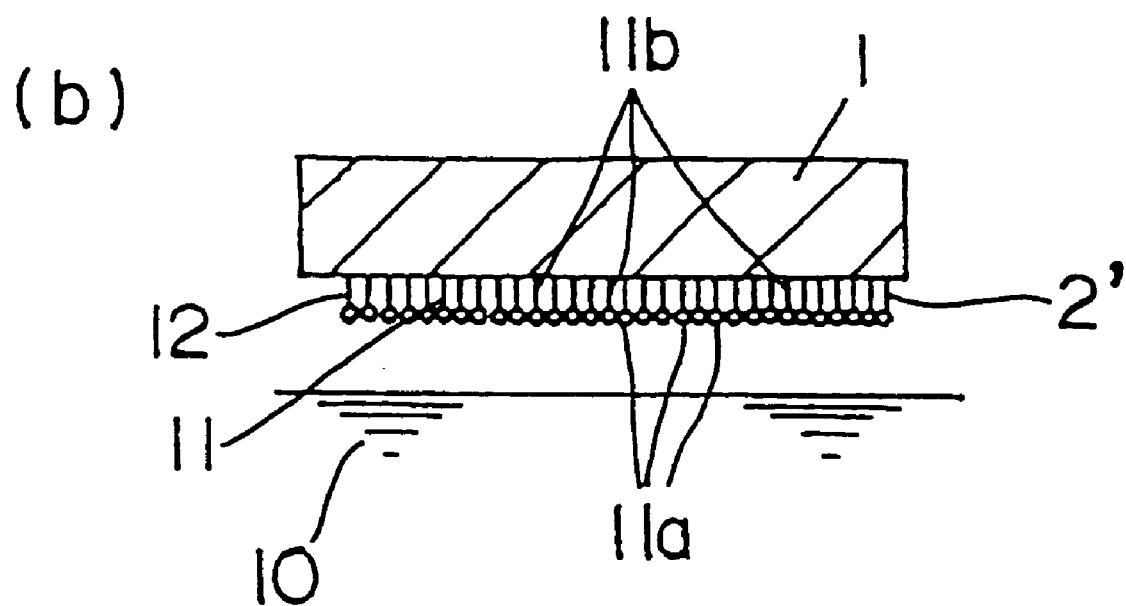

The process for forming the polymer thin film on the surface of the hydrophobic aerogel layer by the horizontal dipping method is shown in FIG. 2. When a water-insoluble solution of an amphipatic polymer is spread on the water surface (10), each polymer molecule (11) is oriented parallel with one another on the water surface in a direction such that a hydrophilic portion (11a) of the molecule (11) is in contact with water (10) and a hydrophobic (lipophilic) portion (11b) of the molecule (11) is out of contact with water, and thereby a polymer thin film (12) is formed as shown in FIG. 2(a). Then, a surface of the aerogel layer (1) is disposed horizontally and laid on the polymer thin film (12), and thereby the hydrophobic portion (11b) of each polymer molecule (11) adheres to the hydrophobic surface of the aerogel layer (1). Next, by lifting up the aerogel layer (1), the polymer film (12) is transferred from the water surface to the surface of the aerogel layer (1) with the hydrophobic portion (11b) of each polymer molecule (11) attached to the surface of the aerogel layer (1), so that the LB film (2') is formed on the surface of the aerogel layer (1), as shown in FIG. 2(b). In the LB film (2') of only one layer which is formed by this one time such attachment operation, each polymer (11) constituting the LB (2') is so oriented that the hydrophobic portion (11b) faces to the aerogel layer (1) and the hydrophilic portion (11a) faces in the opposite direction. Therefore, the surface of the LB film (2') presents hydrophilicity since the hydrophilic portion (11a) of each polymer (11) is exposed on the surface of the LB film (2').

Figure 3:
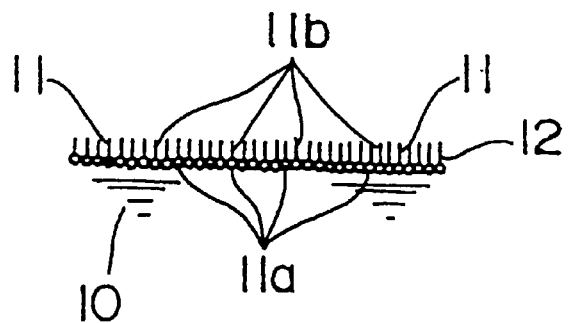
FIGS. 3(a), 3(b) and 3(c) schematically show a process for forming a thin film on a surface of an aerogel layer by the LB method.
Figure 3:
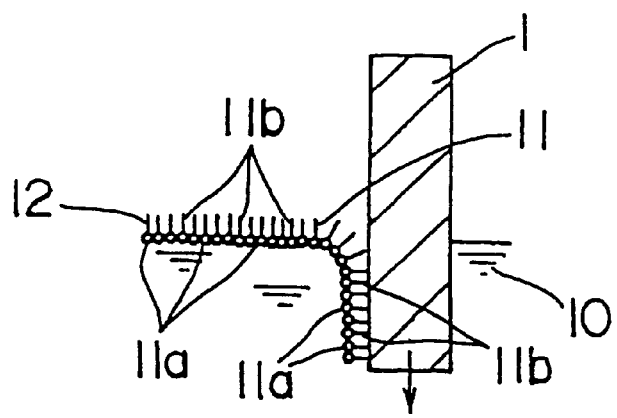
Figure 3:
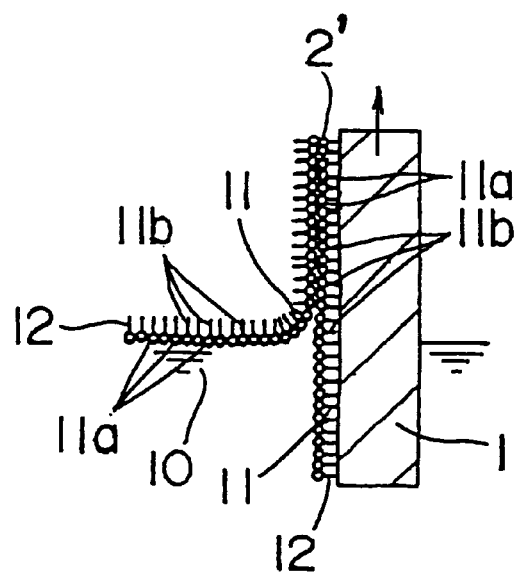

FIG. 3 shows the process for forming the polymer thin film on the surface of the hydrophobic aerogel layer by the vertical dipping method. When a water-insoluble solution of an amphipatic polymer is spread on a water surface (10), each polymer molecule (11) is oriented parallel with one another in the direction such that a hydrophilic portion (11a) of the molecule (11) is in contact with water (10) and a hydrophobic (lipophilic) portion (11b) of the molecule (11) is out of contact with water, and thereby a polymer thin film (12) is formed on the water surface in the same manner as described above, as shown in FIG. 3(a). Then, when the aerogel layer (1) is dipped into water with the surface of the aerogel layer (1) vertical to the water surface, the hydrophobic portion (11b) of each polymer (11) adheres to the hydrophobic surface of the aerogel layer (1), and thereby the polymer thin film (12) is formed on the surface of the aerogel layer (1) such that the hydrophobic portions (11b) face to the aerogel layer (1) and the hydrophilic portions (11a) are disposed so as to be exposed on the surface as shown in FIG. 3(b). Therefore, the surface of the first polymer film (12) formed on the surface of the aerogel layer (1) presents hydrophilicity. Next, by drawing upward the aerogel layer (1) from water, the polymer film (12) on the water surface is so transferred that the hydrophilic portions (11a) thereof adhere to the surface of the first polymer thin film (12) since the surface of the first polymer thin film (12) is hydrophilic. As a result, a polymer thin film (12) having a bilayer structure is formed on the surface of the aerogel layer (1), as shown in FIG. 3(c). The hydrophobic portions (11b) are exposed on the surface of the bilayer LB film (2') formed in such manner, and thereby the surface of the LB film presents hydrophobicity.

The thickness of the LB film is preferably 0.001 to 0.1 μm. When the thickness is below 0.001 μm, no sufficiently smooth layer is formed because the ruggedness due to the pores in the surface of the aerogel layer appears on the surface of the LB film. When the thickness is above 0.1 μm, it is difficult to utilize sufficiently the properties of the aerogel layer (such as a high heat insulating property, a high electrically insulating property, a low refractive index, a low dielectric constant and so on) in the aerogel substrate.

The functional layer is formed on a surface of the LB film. Since the LB film provides a smooth surface, the functional layer is formed uniformly on the surface of the LB film and performs its function effectively. In the case where the LB film (2') is hydrophilic, the functional layer can be formed uniformly by a method in which an aqueous fluid for coating is applied and thereafter dried. The functional layer is the same as described above in connection with the aerogel substrate of the first embodiment in the first aspect, and therefore the detailed explanation thereof is omitted here.

The aerogel substrate of the fifth embodiment in the first aspect has a construction, for example, as shown in FIGS. 1(b) and 1(c). When the aerogel substrate of the fifth embodiment in the first aspect has the construction as shown in FIG. 1(b), the LB film is the layer denoted by the numeral "2" and the functional layer is the layer which is formed on the surface of the layer (2) and denoted by the numeral "3". When the aerogel layer is formed on a surface of a plate member such as a glass plate, the aerogel substrate has the construction as shown in FIG. 1(c) in which the aerogel layer (1) as a thin film, the LB film (2) and the functional layer (3) are laminated on the surface of the plate member (100) in thus listed order.

The aerogel substrate of the sixth embodiment in the first aspect comprises the inorganic layered compound layer which is formed on at least one surface of the aerogel layer, and the functional layer which is formed on the surface of the inorganic layered compound layer. The meaning of "at least one surface" is the same as described above in connection with the aerogel substrate of the first embodiment in the first aspect, and therefore the detailed explanation thereof is omitted here.

In the inorganic layered compound layer, plural layers of the inorganic compound are superposed one upon another (or the other). The inorganic layered compound layer is formed by having the surface of the aerogel layer adsorb the inorganic layered compound. As described above, the solvent in which the inorganic layered compounds are dispersed is not involved in the formation of the layer during the process of the adsorption of the inorganic layered compound. Therefore, the inorganic layered compound layer does not contain water even if the inorganic layered compound layer is formed by dispersing the inorganic layered compound in, for example, water followed by contacting the surface of the aerogel layer with such water to form the inorganic layered compound layer and thereafter taking out the aerogel layer from water.

The adsorption of the inorganic layered compound by the aerogel layer occurs by the Coulomb force acting between charges on the surface of the aerogel layer and charges on cleavage planes formed by cleavage of the inorganic layered compound in the solvent. The thickness of the inorganic layered compound layer formed on the surface of the aerogel layer is usually several nanometers because the inorganic layered compound is adsorbed by the surface of the aerogel layer in an amount which is necessary for counteracting the charges on the surface of the aerogel layer and because the cleavage generally occurs with the several molecules superposed one upon another. When the inorganic layered compound can be cleft into a monomolecule, the thickness of the inorganic layered compound layer is about 1 nm, and even if the inorganic layered compound layer has such a thickness, it can provide a smooth surface suitable for forming the functional layer thereon.

The inorganic layered compound is adsorbed by the surface of the aerogel layer by contacting the aerogel layer with a treatment liquid in which the inorganic layered compound is dispersed in a solvent. The aerogel layer may be contacted with the treatment liquid by, for example, being dipped in the treatment liquid. The concentration of the inorganic layered compound in the treatment liquid is 1% by mass or below such that the inorganic layered compound can cleave. The lower the concentration of the inorganic layered compound is, the higher the degree of dispersion is. However, if the concentration of the inorganic layered compound is too low, it is difficult for the inorganic layered compound to be adsorbed by the aerogel layer. Therefore, the concentration of the inorganic layered compound is preferably 0.001% by mass or more. In the case where the aerogel layer is dipped in the treatment liquid, the aerogel (particularly silica aerogel) which has been subjected to the hydrophobing treatment is preferably used in order to prevent the break of the microporous structure of the aerogel layer.

A phyllosilicate mineral may be used as the inorganic layered compound, such as Na-montmorillonite, Ca-montmorillonite, synthetic smectite, Na-taeniolite, Li-taeniolite, Na-hectorite, Li-hectorite, acid clay, synthetic mica or the like. Water may be used as the solvent. The above phyllosilicate mineral is swollen by penetration of a water molecule into the layered compound, and easily cleft into tabular materials of which thickness is several nanometers and of which diameter in its plane direction is several tens to several hundreds nanometers when a force is applied for example by the use of an ultrasonic or when the compound concentration of the treatment liquid is low. The inorganic layered compound layer may be made of one or more kinds of the inorganic layered compounds.

An ionic polymer may be attached to the surface of the aerogel layer before the inorganic layered compound layer is formed. The attachment of the ionic polymer makes it possible to increase the adhesion force between the inorganic layered compound layer and the aerogel layer. The ionic polymer is not particularly limited as long as it is ionic. A cationic polymer such as a poly(allylaminehydrochloride), a poly(ethyleneimine) or a poly-(diallyldimethyl-ammoniumchloride), and an anionic polymer such as a poly(styrenesulfonate) or a poly(vinylsulfate) are exemplified as the ionic polymer. The ionic polymer is attached to the surface of the aerogel layer by dipping the aerogel layer in an aqueous solution of the ionic polymer or by the LB method. Plural inorganic layered compound layers can be formed on the surface of the aerogel layer by repeating the adhesion of the ionic polymer and the adsorption of the inorganic layered compound layer.

The thickness of the inorganic layered compound layer is preferably 0.01 to 1 $\mu$m.

The functional layer is formed on the surface of the inorganic layered compound layer. The inorganic layered compound layer provides the smooth surface, and thereby, the functional layer is formed uniformly thereon and performs its function effectively. The functional layer is the same as described above in connection with the aerogel substrate of the first embodiment in the first aspect, and therefore the detailed explanation thereof is omitted here.

The aerogel substrate of the sixth embodiment in the first aspect has a construction, for example, as shown in FIGS. 1(b) and 1(c). When the aerogel substrate of the sixth embodiment in the first aspect has the construction as shown in FIG. 1(b), the inorganic layered compound layer is the layer denoted by the numeral "2" and the functional layer is the layer which is formed on the surface of the inorganic layered compound layer (2) and denoted by the numeral "3". When the aerogel layer is formed on a surface of a plate member such as a glass plate, the aerogel substrate has the construction as shown in FIG. 1(c) in which the aerogel layer (1) as a thin film, the inorganic layered compound layer (2) and the functional layer (3) are laminated on the surface of the plate member (100) in thus listed order.

Effects which are given by the aerogel substrates and the process for producing the same according to the present invention which are described in the above are as follows:

The aerogel substrate comprises the aerogel layer, the intermediate layer which is formed on at least one surface of the aerogel layer and the functional layer which is formed on the surface of the intermediate layer, the functional layer being formed on the surface of the intermediate layer without a material which constitutes the functional layer penetrating into the aerogel layer. In this aerogel substrate, the material(s) which constitutes the functional layer does not penetrate into the aerogel layer, and therefore the functional layer constitutes the aerogel substrate as a uniform layer of which surface is continuous with a small surface roughness, and performs a predetermined function well.

In the aerogel substrate of the present invention, the intermediate layer is preferably the layer which prevents the material(s) constituting the functional layer from penetrating into the aerogel layer. Such intermediate layer makes it possible to form a uniform and thin functional layer on the surface of the aerogel layer by the conventional method.

The aerogel substrate of the present invention is realized by using the hydrophobic aerogel layer as the aerogel layer and forming the intermediate layer of the hydrophilic layer which is obtained by subjecting the surface of the hydrophobic aerogel layer to the hydrophilicizing treatment; and the coating layer formed on the surface of the hydrophilic layer. Such aerogel substrate is characterized in that only the surface of the hydrophobic aerogel layer has been hydrophilicized by the plasma treatment or the UV ozone treatment and the inside thereof remains hydrophobic. This characteristic makes it possible to uniformly coat the surface of the aerogel layer with the aqueous fluid for coating to form the uniform thin film on the surface of the hydrophobic aerogel layer. Further, no aqueous fluid for coating penetrates into the aerogel layer to break the microporous structure thereof. The film formed with the aqueous fluid for coating provides the smooth surface and allow the functional layer to be formed uniformly on the surface.

The aerogel substrate of the present invention is preferably realized by the aerogel substrate in which the hydrophobic aerogel layer is used as the aerogel layer; the intermediate layer is the hydrophilic layer which is formed by subjecting the surface of the hydrophobic aerogel layer to the hydrophilicizing treatment; and the functional layer is the coating layer formed on the surface of the hydrophilic layer. Such aerogel substrate is characterized in that the surface of the hydrophobic aerogel layer is hydrophilicized so that the functional layer may be formed directly on the surface of the aerogel layer. This aerogel substrate is a variation of the aerogel substrate of the first embodiment and it can be produced by fewer steps than the aerogel substrate of the first embodiment.

Further, the aerogel substrate of the present invention is preferably realized by the aerogel substrate in which the intermediate layer is the inorganic layer or the organic layer formed by the gas phase method. The gas phase method which is a dry process makes it possible to form the thin film having the smooth surface as the intermediate layer on the surface of the aerogel layer without breakage of the microporous structure of the aerogel due to a liquid substance. The inorganic layer or the organic layer fills the pores in the surface of the aerogel layer to provide the smooth surface, and thereby the functional layer can be formed uniformly on the surface of the inorganic or organic layer.

Further, the pores in the surface of the aerogel are surely filled and the unevenness of the surface of the aerogel layer is "evened out" effectively by the gas phase method since the method can easily control the thickness of the film (layer) to be formed.

In the aerogel substrate in which the layer formed by the gas phase method is made of silica, the adhesion force between the aerogel layer and the silica film is large, and the pores in the surface of the aerogel layer are filled better. Thus, when the layer made of silica is formed by the gas phase method, a smoother surface is formed, and therefore, the aerogel substrate is obtained in which the functional layer is formed more uniformly. This is also applicable to the case where the layer formed by the gas phase method is made of SiN, SiON or $TiO_2$.

The aerogel substrate of the present invention is preferably realized by the aerogel substrate in which the intermediate layer is the welded layer formed by heating the surface of the aerogel layer. The welded layer provides the dense and smooth surface formed by closing the pores in the surface of the aerogel. Therefore, the welded layer makes it possible to form the functional layer uniformly thereon.

The aerogel substrate of the present invention is preferably realized by the aerogel substrate in which the intermediate layer is the Langmuir-Blodgett film. The Langmuir-Blodgett film provides the smooth surface suitable for forming the functional thin film thereon. The Langmuir-Blodgett film is formed without breaking the microporous structure of the aerogel layer. Further, the thickness of the LB film can be very thin, for example several nanometers thickness if necessary, and controlled by a nanoscale by varying a length of the side-chain of the polymer. Therefore, no degradation of the function of the functional layer due to the thick layer between the functional layer and the aerogel layer is caused in the aerogel substrate comprising the Langmuir-Blodgett film.

The aerogel substrate of the present invention is realized also by the aerogel substrate in which the intermediate layer is the inorganic layered compound layer. The solvent is not involved in the formation of the inorganic layered compound layer when the layer is formed. Therefore, the inorganic layered compound layer is formed on either the hydrophobic aerogel layer or the hydrophilic aerogel layer to provide the smooth surface, and makes it possible to form the functional layer uniformly.

In the aerogel substrate of the present invention, in the case where the aerogel is the silica aerogel, moisture adsorption by the aerogel layer is prevented, and therefore deterioration of the various properties of the aerogel due to aging is prevented.

In the aerogel substrate of the present invention, in the case where the functional layer is the thin film of the electrically conductive material, the circuit board in which the low dielectric constant of the aerogel, particularly the silica aerogel is utilized is obtained.

In the aerogel substrate of the present invention, in the case where the functional layer is the infrared ray reflective thin film, the heat insulating substrate in which the low thermal conductivity of the aerogel, particularly the silica aerogel is utilized is obtained.

In the aerogel substrate of the present invention, in the case where the functional layer is the optical waveguide thin film, the optical waveguide substrate in which the low refractive index of the aerogel, particularly the silica aerogel is utilized is obtained.

In the aerogel substrate of the present invention, in the case where the functional layer is the transparent and electrically conductive thin film, the transparent and electrically conductive thin film substrate in which the low refractive index of the aerogel, particularly the silica aerogel is utilized is obtained.

In the aerogel substrate of the present invention, in the case where the functional layer is the fluorescent layer, the light emitting device in which the low refractive index of the aerogel, particularly the silica aerogel is utilized is obtained.

INDUSTRIAL APPLICABILITY

The aerogel substrate of the present invention effectively presents properties of the functional layer coupled with properties of the aerogel, and can be applied as a high performance substrate in various fields such as an electronics field. Depending on the kinds of the functional layers, the aerogel substrate of the present invention can be used as the electrically conductive substrate, the heat insulating substrate, the optical waveguide substrate, the substrate for the light emitting device, or the light emitting device. These substrates are suitable for constituting a CRT, an FED, an inorganic EL device, an organic EL device, a plasma display panel, a flat fluorescent lamp, an LCD and so on. The process for producing the aerogel substrate of the present invention makes it possible to form the functional layer uniformly on the surface of the aerogel layer on which it has been difficult to form a thin film. Therefore, the production process of the aerogel substrate according to the present invention is also a useful process for forming a thin film in which process a desired thin film is formed uniformly on a surface of the aerogel.

EXAMPLES

The present invention will be, hereinafter, explained more concretely with reference to the following Examples.

Example 1

An aerogel substrate having a construction as shown in FIG. 1(c) was produced according to the following procedures.

Solution A was prepared by mixing an oligomer of tetramethoxysilane (manufactured by Colcoat Co. Ltd., trade name "Methylsilicate 51")and methanol at a mass ratio of 47:81. Further, Solution B was prepared by mixing water, 28% by mass ammonia aqueous solution and methanol at a mass ratio of 50:1:81. Then, Solution A and Solution B were mixed at a mass ratio of 16:17 to form an alkoxysilane solution, which was dropped onto one surface of a plate member (100) made of soda glass followed by spin-coating at 700 r.p.m. for ten seconds. Then, after gelation of the alkoxysilane to produce a gel compound, the plate with gel was dipped into an aging solution which contained water, 28% by mass ammonia aqueous solution and methanol at a mass ratio of 162:4:640 to age the gel compound for one day at room temperature. Next, the gel compound in the form of a thin film aged as described above was dipped in an isopropanol solution containing 10% by mass of hexamethyldisilazane so as to carried out the hydrophobing treatment. The gel compound in the form of the thin film thus formed on the surface of the glass plate was dipped in the isopropanol so as to wash the gel compound. Then, the gel compound was placed in a autoclave, which was filled with liquefied carbon dioxide, and then the gel compound was dried by the supercritical drying under conditions of 80° C. and 16 MPa, whereby a thin film of silica aerogel (1) of which thickness was 30 µm was formed on the surface of the glass plate (100).

A silica thin film (2) of which thickness was 100 nm was formed on the surface of the silica aerogel thin film (1). The silica thin film was formed by the deposition using tetraethoxysilane through the CVD method under conditions of 200° C., 3 Pa and 700 W. Next, a transparent and electrically conductive thin film (3) of IXO of which thickness was 200 nm was formed on the surface of the silica thin film (2) by the sputtering under conditions of room temperature, 0.7 Pa and 100 W, whereby a substrate for an EL light emitting device was produced.

Example 2

An aerogel substrate having a construction as shown in FIG. 1(c) was produced according to the following procedures.

A silica aerogel thin film (1) was formed on one surface of a soda glass plate (100) in the same manner as in Example 1. Next, a silica thin film (2) of which thickness was 100 nm was formed on the surface of the silica aerogel thin film (1). The silica thin film (2) was formed by the sputtering method under conditions of 200° C., 0.7 Pa and 300 W. Then, a transparent and electrically conductive thin film (3) of ITO of which thickness was 200 nm was formed on the surface of the silica thin film (2) by the sputtering under conditions of 200° C., 1 Pa and 300 W, whereby a substrate for an EL light emitting device was produced.

Example 3

An aerogel substrate having a construction as shown in FIG. 1(c) was produced according to the following procedures.

A silica aerogel thin film (1) was formed on one surface of a soda glass plate (100) in the same manner as in Example 1. Next, a copper phthalocyanine thin film (2) of which thickness was 50 nm was formed on the surface of the silica aerogel thin film (1) by the vacuum deposition. Then, an Al thin film as an electrically conductive thin film (3) of which thickness was 50 nm was formed on the surface of the copper phthalocyanine thin film by the vacuum deposition, whereby a substrate for a circuit board was produced.

Example 4

An aerogel substrate having a construction as shown in FIG. 1(c) was produced according to the following procedures.

A silica aerogel thin film (1) was formed on one surface of a soda glass plate (100) in the same manner as in Example 1. Next, a hydrophilic layer (not shown) of which thickness was 50 nm was formed by subjecting the surface of the silica aerogel thin film (1) to the plasma treatment in a helium/argon/oxygen atmosphere by means of the atmospheric pressure plasma technique using an electric power of 700 W. Then, an aqueous fluid for coating containing 10% by mass of silica and 10% by mass of a polyvinyl alcohol was prepared by dissolving the polyvinyl alcohol and dispersing a silica sol. This fluid was applied onto the surface of the silica aerogel thin film (1), and then dried at 105° C., whereby a silica thin film (2) of which thickness was 50 nm was formed. Next, an IXO thin film as a transparent and electrically conductive thin film (3) of which thickness was 200 nm was formed on the surface of the silica thin film (2) by the sputtering under conditions of room temperature, 0.7 Pa and 100 W, whereby a substrate for an EL light emitting device was produced.

Comparative Example 1

Without formation of the silica thin film, an IXO thin film was formed in the same manner as in Example 1 on the surface of the silica aerogel thin film which was formed in the same manner as in Example 1 on one surface of the soda glass, whereby a substrate for a light emitting device was produced.

Comparative Example 2

Without formation of the silica thin film, an ITO thin film was formed in the same manner as in Example 2 on the surface of the silica aerogel thin film which was formed in the same manner as in Example 1 on one surface of the soda glass, whereby a substrate for a light emitting device was produced.

Comparative Example 3

Without formation of the copper phthalocyanine thin film, an Al thin film was formed in the same manner as in Example 3 on the surface of the silica aerogel thin film which was formed in the same manner as in Example 1 on one surface of the soda glass, whereby a circuit board was produced.

An electrical conductivity per 1 cm distance on the outermost surface of the aerogel substrates produced in Examples 1 to 4 and Comparative Examples 1 to 3 was measured with a tester. The results are shown in Table 1 below:

TABLE 1

| | Aerogel layer | Intermediate layer (Formation method) | Functional layer (Formation method) | 1 cm electric resistance (Ω) |
|---|---|---|---|---|
| Example 1 | Silica aerogel thin film | Silica thin film (CVD) | IXO thin film (Sputtering) | 40 |
| Example 2 | Silica aerogel thin film | Silica thin film (Sputtering) | ITO thin film (Sputtering) | 30 |
| Example 3 | Silica aerogel thin film | Copper phthalocyanine thin film (Vacuum deposition) | Al thin film (Vacuum deposition) | 0.3 |
| Example 4 | Silica aerogel thin film | Hydrophilic layer (Plasma treatment)/ Silica + PVA (Coating) | IXO thin film (Sputtering) | 50 |
| Comparative Example 1 | Silica aerogel thin film | — | IXO thin film (Sputtering) | K to M order |
| Comparative Example 2 | Silica aerogel thin film | — | ITO thin film (Sputtering) | K to M order |

TABLE 1-continued

|  | Aerogel layer | Intermediate layer (Formation method) | Functional layer (Formation method) | 1 cm electric resistance (Ω) |
|---|---|---|---|---|
| Comparative Example 3 | Silica aerogel thin film | — | Al thin film (Vacuum deposition) | 70 |

Example 5

An aerogel substrate having a construction as shown in FIG. 1(c) was produced according to the following procedures.

A silica aerogel thin film (1) was formed on one surface of a soda glass plate (100) in the same manner as in Example 1 except that the rotation number of the spin coating was 2000 r.p.m and the thickness of the silica aerogel thin film was 1 μm. Next, a hydrophilic layer of which thickness was 50 nm was formed by subjecting the surface of the silica aerogel thin film (1) to the plasma treatment in a helium/argon/oxygen atmosphere by means of the atmospheric pressure plasma technique using a electric power of 700 W. Then, an aqueous fluid for coating containing 10% by mass of silica and 10% by mass of a polyvinyl alcohol was prepared by dissolving the polyvinyl alcohol and dispersing a silica sol. This fluid was applied onto the surface of the silica aerogel thin film (1), and then dried at 105° C., whereby a silica thin film (2) of which thickness was 50 nm was formed. Then, the fluorescent layer (3) of which thickness was 100 nm was formed on a surface of the silica thin film (2) by the vacuum deposition of aluminum-quinolinol complex (tris(8-quinolinolate)aluminum manufactured by Dojindo Laboratories), whereby a light emitting device was produced.

Example 6

An aerogel substrate having a construction as shown in FIG. 1(b) was produced according to the following procedures.

An alkoxysilane solution which was prepared in the same manner as in Example 1 was cast in a styrene resin made mold and the mold was closed followed by being allowed to stand for gelation and then aging of the alkoxysilane at room temperature. Next, the hydrophobing treatment and the supercritical drying were carried out in the same manner as Example 1 to form a silica aerogel plate (1) of which thickness was 5 mm.

Then, a welded layer of which thickness was 50 nm was formed by the annealing treatment in which one surface of the silica aerogel plate (1) was heated. The heating was carried out by placing the aerogel plate into a furnace at 600° C. for 30 seconds. Then, the aerogel plate was taken out from the furnace and allowed to cool. Next, a fluorescent layer (3) of which thickness was 100 nm was formed on the surface of the welded layer by the vacuum deposition of aluminum-quinolinol complex (tris(8-quinolinolate) aluminum manufactured by Dojindo Laboratories), whereby a light emitting device was produced.

Comparative Example 4

Without formation of the silica thin film, a fluorescent layer was formed in the same manner as in Example 5 on the surface of silica aerogel thin film which was formed on one surface of a soda glass plate in the same manner as in Example 5.

Each of thin film substrates produced in Examples 5 and 6 and Comparative Example 4 was irradiated with black light of 20 W and a luminance of each substrate was measured. The results are shown in Table 2 below.

TABLE 2

|  | Aerogel layer | Intermediate layer (Formation method) | Functional layer (Formation method) | Average luminance (cd/cm²) |
|---|---|---|---|---|
| Example 5 | Silica aerogel thin film | Silica/PVA (Coating) | aluminum-quinolinol (Vacuum deposition) | 2.2 |
| Example 6 | Silica aerogel plate | Welded layer | aluminum-quinolinol (Vacuum deposition) | 2.6 |
| Comparative Example 4 | Silica aerogel thin film | — | aluminum-quinolinol (Vacuum deposition) | 1.5 |

Example 7

An aerogel substrate having a construction as shown in FIG. 1(c) was produced according to the following procedures.

A silica aerogel thin film (1) of which thickness was 1 mm was formed on one surface of a soda glass plate (100) in the same manner as in Example 1. Next, a silica thin film (2) of which thickness was 100 nm was formed in the same manner as in Example 1 on the surface of the silica aerogel thin film (1). Then, an Al thin film of which thickness was 50 nm was formed as an infrared ray reflective thin film (3) in the same manner as in Example 3 on the surface of the silica thin film, whereby a heat insulating substrate was produced.

Example 8

An aerogel substrate having a construction as shown in FIG. 1(b) was produced according to the following procedures.

A silica aerogel plate of which thickness was 5 mm was produced in the same manner as in Example 6. Next, a silica thin film (2) of which thickness was 100 nm was formed in the same manner as in Example 1 on the surface of the silica aerogel plate (1). Then, an Al thin film (3) of which thickness was 50 nm was formed as an infrared ray reflective thin film in the same manner as in Example 3 on the surface of the silica thin film, whereby a heat insulating substrate was produced.

Comparative Example 5

An Al thin film of which thickness was 50 nm was formed as an infrared ray reflective thin film in the same manner as in Example 3 on one surface of a soda glass plate which surface did not have a silica thin film thereon, whereby a heat insulating substrate was produced.

Comparative Example 6

Without formation of the silica thin film, an Al thin film having a thickness of 50 nm was formed as an infrared ray reflective thin film in the same manner as in Example 3 on one surface of a silica aerogel plate having a thickness of 5 mm which was formed in the same manner as in Example 6, whereby a heat insulating substrate was produced.

As to each of the thin film substrates produced in Examples 7 and 8 and Comparative Examples 5 and 6, a thermal conductivity was measured according to ASTM and a transmittance of an infrared ray having a wavelength of 1000 nm was measured with a spectrophotometer. The results are shown in Table 3 below.

TABLE 3

| | Aerogel layer | Intermediate layer (Formation method) | Functional layer (Formation method) | Thermal cond. (W/mk) | IR transmittance (%) |
|---|---|---|---|---|---|
| Example 7 | Silica aerogel thin film | Silica thin film (CVD) | Al thin film (Vacuum deposition) | 0.35 | 20 |
| Example 8 | Silica aerogel thin film | Silica thin film (CVD) | Al thin film (Vacuum deposition) | 0.013 | 18 |
| Comparative Example 5 | — | — | Al thin film (Vacuum deposition) | 1.3 | 18 |
| Comparative Example 6 | Silica aerogel thin film | — | Al thin film (Vacuum deposition) | 0.013 | 55 |

Example 9

An aerogel substrate having a construction as shown in FIG. 1(b) was produced according to the following procedures.

A hydrophobic silica aerogel thin film (1) of which thickness was 20 μm was formed on one surface of a soda glass plate (100) in the same manner as in Example 1. Next, the silica aerogel thin film (1) with the glass plate (100) was dipped in an aqueous solution containing 5.0% by mass of a poly(diallyldimethylammoniumchloride) for 10 minutes followed by being dipped in pure water for 10 minutes, and thereby the poly(diallyidimethyl-ammoniumchloride) as an ionic polymer was attached to the surface of the silica aerogel thin film (1). Then, the aerogel thin film (1) with the glass plate (100) was dipped in a treatment liquid in which synthetic hectorite (manufactured by Laporte Kogyo, trade name "Laponite RD")was dispersed in water at a concentration of 0.2% by mass by the vertical dipping method and allowed to stand for 10 minutes followed by being dipped in pure water for 10 minutes, and thereby an inorganic layered compound layer (2) of the synthetic hectorite of which thickness was 0.01 μm was formed. Then, an ITO thin film as a transparent and electrically conductive thin film (3) of which thickness 100 nm was formed on one surface of the inorganic layered compound layer (2) by the sputtering under conditions of 200° C., 1 Pa and 100 W, whereby a substrate for a light emitting device was produced.

Comparative Example 7

A substrate for a light emitting device was produced in the same manner as in Example 9 except that no ionic polymer was attached and no inorganic layered compound layer was formed.

An electrical conductivity per 1 cm distance on the outermost surface of the aerogel substrates produced in Example 9 and Comparative Example 5 was measured with a tester. The results are shown in Table 4 below:

TABLE 4

| | Aerogel layer | Intermediate layer | Functional layer (Formation method) | 1 cm electric resistance (Ω) |
|---|---|---|---|---|
| Example 9 | Silica aerogel thin film | Ionic polymer/ Inorganic layered compound layer | ITO thin film (Sputtering) | 30 |
| Comparative Example 7 | Silica aerogel thin film | — | ITO thin film (Sputtering) | K to M order |

Example 10

An aerogel substrate having a construction as shown in FIG. 1(c) was produced according to the following procedures.

A hydrophobic silica aerogel thin film (1) of which thickness was 10 μm was formed on one surface of the soda glass plate (100) in the same manner as in Example 1. Next, an LB film (2) of which thickness was 10 nm was formed on the surface of the aerogel thin film (1) by attaching a polyvinyl octanal acetal to the surface by the vertical dipping method at a surface pressure of 25 mN/m. The LB film (2) was formed of a single layer of the polymer and its surface was hydrophilic. Then, an IXO thin film (3) of which thickness was 200 nm was formed as an electrically conductive thin film on the surface of the LB film (2) by the sputtering under conditions of room temperature, 0.7 Pa and 100 W, whereby a substrate for a light emitting device was produced.

Example 11

A substrate for a light emitting device was produced in the same manner as in Example 10 except that an ITO film (3) as an electrically conductive thin film of which thickness was 200 nm was formed on the surface of the LB film (2) by the sputtering under conditions of 200° C., 1 Pa and 300 W.

Example 12

An aerogel substrate having a construction as shown in FIG. 1(c) was produced according to the following procedures.

A hydrophobic silica aerogel thin film (1) of which thickness was 20 μm was formed on one surface of a soda glass plate (100) in the same manner as in Example 1. Next, a polymer thin film of which thickness was 10 nm was formed on the surface of the hydrophobic aerogel thin film (1) by attaching a polyvinyl octanal acetal to the surface by the vertical dipping method at a surface pressure of 25 mN/m. Further, another polymer thin film of which thickness was 10 nm was formed by attaching a polyvinyl octanal acetal to the surface of the polymer film by the vertical dipping method at a surface pressure of 25 mN/m. As a result, a two-layer LB film (2) of which surface was hydrophobic was formed on the surface of the hydrophobic silica aerogel thin film. Next, an ITO film (3) as an electrically conductive thin film of which thickness 200 nm was formed on the surface of the LB film (2) by the sputtering under conditions of 200° C., 1 Pa and 300 W, whereby a substrate for a light emitting device was produced.

Comparative Example 8

A substrate for a light emitting device was produced in the same manner as in Example 10 except that no LB film was formed.

Comparative Example 9

A substrate for a light emitting device was produced in the same manner as in Example 11 except that no LB film was formed.

An electrical conductivity per 1 cm distance on the outermost surface of the aerogel substrates produced in Examples 10 to 12 and Comparative Examples 6 and 7 was measured with a tester. The results are shown in Table 5 below:

TABLE 5

| | Aerogel layer | Intermediate layer | Functional layer (Formation method) | 1 cm electric resistance (Ω) |
|---|---|---|---|---|
| Example 10 | Silica aerogel thin film | LB film | IXO thin film (Sputtering) | 50 |
| Example 11 | Silica aerogel thin film | LB film | ITO thin film (Sputtering) | 30 |
| Example 12 | Silica aerogel thin film | LB film (two layers) | ITO thin film (Sputtering) | 10 |
| Comparative Example 8 | Silica aerogel thin film | — | IXO thin film (Sputtering) | K to M order |
| Comparative Example 9 | Silica aerogel thin film | — | ITO thin film (Sputtering) | K to M order |

Example 13

An aerogel substrate having a construction as shown in FIG. 1(b) was produced according to the following procedures.

A hydrophobic silica aerogel thin film (1) of which thickness was 30 μm was formed on one surface of a soda glass plate (100) in the same manner as in Example 1. Next, a hydrophilic layer (not shown) of which thickness was 50 nm was formed on the surface of the silica aerogel by subjecting the surface of the silica aerogel thin film (1) to the plasma treatment in a helium/argon/oxygen atmosphere through the atmospheric pressure plasma technique using an electric power of 700 W. Then, an aqueous fluid for coating containing 30% by mass of indium-tin oxide and 3% by mass of a polyvinyl alcohol was prepared by dissolving the polyvinyl alcohol and dispersing indium-tin oxide powder. This fluid was applied onto the surface of the silica aerogel thin film (1), and then calcinated at 600° C., whereby an ITO thin film of which thickness was 2 μm was formed as a transparent and electrically conductive thin film (3).

An electrical conductivity per 1 cm distance on the outermost surface of the aerogel substrates produced in Example 13 was measured with a tester. The results are shown in Table 6 below:

TABLE 6

| | Aerogel layer | Intermediate layer | Functional layer (Formation method) | 1 cm electric resistance (Ω) |
|---|---|---|---|---|
| Example 13 | Silica aerogel thin film | Hydrophilic layer | ITO thin film (Coating) | 200 |

What is claimed is:

1. An aerogel substrate, comprising an aerogel layer, an intermediate layer formed on a surface of the aerogel layer, and a functional layer formed on a surface of the intermediate layer without penetration into the aerogel layer, wherein the functional layer is an infrared ray reflective thin film;

an optical waveguide thin film;

a transparent and electrically conductive thin film comprising at least one member selected from the group consisting of indium-tin oxide, indium-zinc oxide, silver, and chromium;

a fluorescent layer; or an electrically conductive thin film; provided that when the functional layer is an electrically conductive thin layer, then the intermediate layer is copper phthalocyanine.

2. The aerogel substrate according to claim 1, wherein the intermediate layer prevents the material which constitutes the functional layer from penetrating into the aerogel layer.

3. The aerogel substrate according to claim 2, wherein the aerogel layer comprises a hydrophobic aerogel layer, the intermediate layer comprises a hydrophilic layer and a coating layer, wherein the hydrophilic layer is formed by subjecting a surface of the hydrophobic aerogel layer to a hydrophilicizing treatment, the coating layer is formed on a surface of the hydrophillic layer, and wherein the functional layer is formed on a surface of the coating layer.

4. The aerogel substrate according to claim 2, wherein the intermediate layer comprises at least one member selected from the group consisting of an inorganic layer or an organic layer, wherein the inorganic layer and the organic layer are formed by a gas phase method.

5. The aerogel substrate according to claim 4, wherein the inorganic layer is made of an inorganic material selected from SiO2, SiN, SiON and TiO2.

6. The aerogel substrate according to claim 2, wherein the intermediate layer is a welded layer which is formed by heating at least one surface of the aerogel layer.

7. The aerogel substrate according to claim 2, wherein the intermediate layer is a Langmuir-Blodgett film.

8. The aerogel substrate according to claim 2, wherein the intermediate layer comprises at least one inorganic layer.

9. The aerogel substrate according to claim 1, wherein the aerogel layer is a hydrophobic aerogel layer, the intermediate layer is a hydrophilic layer which is formed by subjecting a surface of the hydrophobic aerogel layer to a hydrophilicizing treatment, and the functional layer is formed on a surface of the hydrophilic layer.

10. The aerogel substrate according to claim 1, wherein the aerogel is a silica aerogel.

11. The aerogel substrate according to claim 1, wherein the aerogel layer is formed on a plate member.

12. The aerogel substrate according to claim 1, wherein the functional layer comprises at least one member selected from the group consisting of aluminum-quinolinol, $Y_2O_3$:Eu, $LaPO_4$:Ce, Tb, and $BaMGAL_{10}O_{17}$:Eu.

13. A process for producing the aerogel substrate according to claim 3 comprising the steps of
forming a hydrophilic layer by subjecting at least one surface of an aerogel layer to a plasma treatment or a UV ozone treatment; and
forming a functional layer by coating a surface of the hydrophilic layer with an aqueous solution and/or an aqueous dispersion of a film-forming component followed by drying the solution and/or the dispersion.

14. The process according to claim 13, wherein the aerogel is a silica aerogel.

15. The process according to claim 13 wherein the functional layer is formed by a coating method or gas phase method.

16. A process for producing an aerogel substrate having a functional layer on at least one surface thereof comprising the steps of:
forming an intermediate layer on at least one surface of an aerogel layer; and
forming a functional layer on a surface of the intermediate layer,
said intermediate layer being a layer which prevents a material which constitutes the functional layer from penetrating into the aerogel layer, wherein the functional layer is
an infrared ray reflective thin film;
an optical waveguide thin film;
a transparent and electrically conductive thin film comprising at least one member selected from the group consisting of indium-tin oxide indium-zinc oxide, silver, and chromium;
a fluorescent layer;
or an electrically conductive thin film; provided that when the functional layer is an electrically conductive thin layer, then the intermediate layer is copper phthalocyanine.

17. The process according to claim 16, wherein forming the intermediate layer comprises the steps of:
forming a hydrophilic layer by subjecting at least one surface of a hydrophobic aerogel layer to a plasma treatment or a UV ozone treatment; and
forming a coating layer by coating a surface of the hydrophilic layer with an aqueous solution and/or an aqueous dispersion of a film-forming component followed by drying the solution and/or the dispersion.

18. The process according to claim 16, wherein the step of forming the intermediate layer comprises the step of forming an inorganic layer or an organic layer by a gas phase method on at least one surface of the aerogel layer.

19. The process according to claim 18, wherein the gas phase method is selected from a CVD method, a sputtering method and a vapor deposition method.

20. The process according to claim 16, wherein the step of forming the intermediate layer comprises the step of forming a welded layer by heating at least one surface of the aerogel layer.

21. The process according to claim 16, wherein the step of forming the intermediate layer comprises the step of forming a thin film on at least one surface of the aerogel layer by the Langmuir-Blodgett method.

22. The process according to claim 16, wherein the step of forming the intermediate layer comprises the step of forming an inorganic layered compound layer by having at least one surface of an aerogel layer adsorb an inorganic layered compound.

23. The process according to claim 16, wherein the aerogel is a silica aerogel.

24. The process according to claim 16, wherein the functional layer is formed by a coating method or a gas phase method.

25. The process according to claim 16, wherein the functional layer comprises at least one member selected from the group consisting of aluminum-quinolinol, $T_2O_3$:Eu, $LaPO_4$:Ce, Tb, and $BaMGAL_{10}O_{17}$:Eu.

* * * * *

UNITED STATES PATENT AND TRADEMARK OFFICE
CERTIFICATE OF CORRECTION

PATENT NO. : 6,740,416 B1
DATED : May 25, 2004
INVENTOR(S) : Hiroshi Yokogawa et al.

It is certified that error appears in the above-identified patent and that said Letters Patent is hereby corrected as shown below:

Column 4,
Line 19, "Which" should read -- which --.

Column 6,
Line 3, after "and" insert the text from lines 28-52:
-- electrically conductive thin film can be made of a
transparent and electrically conductive material selected from indium-tin oxide (ITO), indium-zinc oxide (IXO), silver, chromium and so on. The aerogel substrate having the transparent and electrically conductive thin film can constitute, for example, an EL light emitting device. The EL light emitting device is formed by providing an EL (electroluminescence) layer on a surface of the transparent and electrically conductive thin film of the aerogel substrate and providing a back metal electrode on a surface of the EL layer. The EL layer can be made of a luminescent material conventionally used in the organic EL or inorganic EL. The light is emitted from the EL layer by applying an electric field between the transparent and electrically conductive thin film and the back metal electrode. This EL light emitting device can be used for various kinds of displays.
      The light emitting device in which the aerogel layer is a silica aerogel layer can be used as an EL light emitting device of which external efficiency upon coupling out the light generated in the EL layer is high. This is because the silica aerogel has a very low refractive index of 1.008 to 1.3. Further, the light emitting device comprising the silica aerogel layer make it possible to produce a display having a function of protection of a front light for a reflective liquid --

Column 6,
Delete lines 28-52.

Column 12,
Line 37,"hexamethyidisiloxane" should read -- hexamethyldi-siloxane --.

UNITED STATES PATENT AND TRADEMARK OFFICE
CERTIFICATE OF CORRECTION

PATENT NO. : 6,740,416 B1
DATED : May 25, 2004
INVENTOR(S) : Hiroshi Yokogawa et al.

It is certified that error appears in the above-identified patent and that said Letters Patent is hereby corrected as shown below:

Column 29,
Line 41, "poly diallyidimethyl-ammoniumchloride" should read -- poly (diallyldimethyl-ammoniumchloride) --

Signed and Sealed this

Twenty-fifth Day of January, 2005

JON W. DUDAS
*Director of the United States Patent and Trademark Office*